United States Patent [19]

Fossum et al.

[11] Patent Number: 5,880,691

[45] Date of Patent: Mar. 9, 1999

[54] CAPACITIVELY COUPLED SUCCESSIVE APPROXIMATION ULTRA LOW POWER ANALOG-TO-DIGITAL CONVERTER

[75] Inventors: Eric R. Fossum, La Crescenta; Zhimin Zhou, Los Angeles; Bedabrata Pain, Los Angeles, all of Calif.

[73] Assignee: California Institute of Technology, Pasadena, Calif.

[21] Appl. No.: 744,957

[22] Filed: Nov. 7, 1996

Related U.S. Application Data

[60] Provisional application No. 60/006,262 Nov. 7, 1995.

[51] Int. Cl.$^6$ ...................................................... H03M 1/38
[52] U.S. Cl. .......................... 341/162; 341/150; 341/141
[58] Field of Search ................................... 341/162, 144, 341/161, 120, 141, 121

[56] References Cited

U.S. PATENT DOCUMENTS

| | | | |
|---|---|---|---|
| 4,940,981 | 7/1990 | Naylor, et al. | 341/161 |
| 4,989,002 | 1/1991 | Tan | 341/120 |
| 5,084,704 | 1/1992 | Parrish | 341/164 |
| 5,248,971 | 9/1993 | Mandl | 341/141 |
| 5,581,252 | 12/1996 | Thomas | 341/144 |
| 5,684,487 | 11/1997 | Timko | 341/172 |

OTHER PUBLICATIONS

Fossum, E.R., Zhou, Z. and Pain, B., "Successive Approximation ADC for Focal–Plane Applications Using Balanced Charge Integrating Amplifiers" SPIE, 1994.

Fossum E.R. and Zhou, Z., "Capacitively Coupled Successive Approximation Ultra Low Power ADC for Focal–Plane Application", SPIE, 1994.

Pain, B. and Fossum, E.R., "Approaches and analysis for on–focal–analog–to–digital conversion", SPIE vol. 2226, 1994.

Fossum, E.R., Zhou, Z. and Pain, B., "Sucessive Approximation ADC for Focal–Plane Applications Using Balanced Charge Integrating Amplifiers" SPIE, 1994.

Fossum E.R. and Zhou, Z., "Capacitively Coupled Sucessive Approximation Ultra Low Power ADC for Focal–Plane Applications", SPIE, 1994.

Pain, B. and Fossum, E.R., "Approaches and analysis for on–focal–analog–to–digital conversion", SPIE vol. 2226, 1994.

*Primary Examiner*—Howard L. Williams
*Attorney, Agent, or Firm*—Fish & Richardson P.C.

[57] ABSTRACT

A capacitively-coupled successive approximation analog-to-digital converter utilizes a capacitively coupled multiplying digital to analog converter to generate a succession of voltages which are compared to the input voltage to be digitized. The capacitively coupled multiplying digital to analog converter generates the required succession of analog voltage levels utilizing very low power in response to digital signals. A double-sided version of the invention processes differential inputs with improved common-non-ideality mode rejection.

6 Claims, 25 Drawing Sheets

CAPACITIVELY COUPLED SUCCESSIVE APPROXIMATION ULTRA LOW POWER ANALOG-TO-DIGITAL CONVERTER

This application claims the benefits of the U.S. Provisional Application Ser. No. 60/006,262, filed on Nov. 7, 1995.

ORIGIN OF THE INVENTION

The invention described herein was made in the performance of work under a NASA Contract and is subject to the provisions of Public Law 95.517 (35 U.S.C. 202) in which the contractor has elected to retain title.

FIELD OF THE INVENTION

The invention is related to analog-to-digital converters, and in particular to capacitively-coupled successive approximation analog-to digital converters.

BACKGROUND AND SUMMARY OF THE INVENTION

There are many applications for analog-to-digital converters. Real world analog information must be converted into a digital form before it can be processed by digital computers. There are a number of types of analog-to-digital converters employing various conversion methods. Each of these methods offer different performance characteristics such as operating speed, power consumption, achievable accuracy, chip area, required amplifier gain, bandwidth, impedance matching and noise.

Conventional electronic systems often package analog-to-digital converters (ADCs) on a separate integrated circuit. Generally, increased electronic integration offers a number of advantages. Hence it is desirable to integrate ADCs onto existing integrated circuit chips. This would reduce the total mass, volume, and system power, as well as the number and volume of power supplies in many systems. An indirect benefit would be a lowering of system design time and design error rate.

One example of an application for such integrated analog-to-digital converters is in the field of semiconductor imagers. There have been recent efforts to implement on-chip ADC onto detector arrays, such as focal-plane arrays (FPAs). Typically, signal chains introduce noise in focal-plane arrays. Therefore, besides the abovedescribed advantages of integrating ADCs, an FPA system with an on-focal-plane (on-chip) ADC would be expected to exhibit superior noise performance. This is due to the inevitable introduction of unwanted noise through cross-talk, clock pickup, power supply noise, electromagnetic interference (EMI) and other mechanisms. Since the serial data rate in the signal chain is typically the highest rate in the entire imaging system, white noise is introduced with a maximum bandwidth. Clock noise and other capacitively-coupled sources are also known to increase with increasing data rates.

On-chip ADCs would operate at a significantly lower bandwidth, ameliorating these effects. Since no off-chip analog cabling is required, pick up and vibration sensitivity would also be eliminated. More fundamentally, multiple sampling, or over-sampling, of the detector signal can be much more effectively performed on the focal plane compared to off-chip. Thus, on-chip ADC would eliminate mechanisms for the introduction of noise, as well as permit increased signal-to-noise ratio through over-sampling techniques. On-focal-plane ADC can also lead to a reduction in total FPA power dissipation.

Furthermore digital signals can be digitally processed on-chip as a further level of integration. For example, on-chip digital signal processing can be used for autonomous sensor control, e.g. exposure control, or for control, of windowed region-of-interest readout. Image compression can also be achieved on-chip to reduce off-chip drive requirements.

The incorporation of high resolution ADCs on focal-plane arrays has proved to be a difficult challenge. There is much less silicon area available on focal-plane arrays than there is on stand-alone ADCs. An ADC with serial architecture would be required to operate with the highest bandwidth of all focal-plane components, since the conversion rate would be the same as the pixel data rate. In a scientific application, a typical pixel data rate is about 100 KHz. In defense applications and in certain scientific applications, data rates in excess 100 MHz are often required. The power dissipation of CMOS at such high data rate circuits is also a concern.

These problems are compounded in scientific applications which routinely require resolutions greater than sixteen bits. This level of resolution generally requires over-sampling techniques that drive the ADC clock rate even higher. On-chip ADCs would also increase focal-plane power dissipation because of the required high speed operation of several analog circuits; compared to the single driver amplifier used in conventional focal-plane readouts. For these reasons, the inventors believe that a serial on-focal-plane ADC architecture would not be optimal.

Another alternative is a massively parallel architecture; for example, with one ADC on each readout pixel in the focal-plane array. However, only a relatively small area is available for most applications; typical pixel size is about 30 $\mu m^2$. Thus, this does not leave enough room for conventional ADC approaches which require a relatively large chip area.

In summary, speed limitations in serial architectures and area limitations in parallel architectures have restricted the implementation of on-focal-plane ADCs. The present inventors have recognized that the use of a semi-parallel architecture can be expected to preserve the advantages, and mitigate the adverse consequences, of both of these architectures. A semi-parallel architecture would, for example, utilize an ADC for every column of the readout. This affords virtually unlimited chip area in one dimension and tight, but feasible, design space in the other dimension. Such tall, skinny, ADCs would operate, in parallel, on one row of image data at a time.

A number of ADC techniques are available for use in focal-plane applications. These conversion methods differ from each other in terms of operating speed, power consumption, achievable accuracy, and chip area. An important difference between on-focal-plane ADC and a single chip monolithic ADC, is that an on-focal- plane ADC must occupy a relatively small chip area. The real estate becomes an even more serious concern for column-parallel approaches. Due to the unavailability of a large chip area, focal-plane ADCs cannot usually take advantage of elaborate trimming techniques for resolution enhancement. Thus, the immunity of the ADC performance to circuit parameter mismatch is a problem.

Low power operation is preferred in focal-plane ADCs. Maximum overall power dissipation in the combined ADCs would typically be limited to one to 20 mW. The required resolution and conversion rates vary widely depending upon applications. The conversion rate depends on the array size, the integration time, and the choice of ADC architecture, and is usually in the range of 1 KHz to 1 MHz. Scientific infrared imagers usually demand high resolution (greater than sixteen bits), but several other applications require only eight to ten bit accuracy. Thus there is a wide range of operating requirements. Conversion rate requirements vary from 1 KHz to 1 MHz, and the bit resolution requirements vary from six to over sixteen bits. There does not appear to be a single ADC algorithm that optimally meets all of these widely varying requirements.

Candidate ADC algorithms which meet some of these constraints include flash ADCs, successive approximation ADCs, single/dual slope ADCs, and over-sampled delta-sigma ADCs. For ADC operation in the two to ten bit range, the inventors have recognized that the successive approximation ADC is an attractive alternative for focal-plane applications. This kind of ADC achieves high resolution at medium speeds and with minimal power dissipation. One advantage with successive approximation is that for n bits, only n comparisons need to be made. This results in high speed and low power dissipation. Furthermore, this architecture does not require excessive chip area.

The successive-approximation analog-to-digital conversion process is essentially a "ranging" algorithm. Each conversion step estimates the upper and lower bound within which the input voltage lies. The analog voltage is approximated to within a small error by successively shrinking these bounds. The ranging can be done in several ways. One successive-approximation algorithm that is compatible with CMOS implementation is described in S. Ogawa, et al., "A switch-capacitor successive-approximation A/D converter", IEEE Trans. Instrum. and Meas., Vol. 42, pp. 847-853, 1993. One disadvantage with that approach is that the residual voltage decimates to approximately $V_{ref}/2^n$ after n conversion steps. As a result, the ADC can be susceptible to circuit noise, offset and non-idealities.

It is hence an object of the present invention to overcome these disadvantages in order to realize many potential advantages of on-focal-plane ADC. It is also an object of the invention to provide an ADC which requires minimal chip area and power consumption. This is done according to the present invention by providing a successive approximation ADC that employs a capacitively-coupled multiplying digital to analog converter ("CCMDAC") to generate comparison voltage. This CCMDAC receives a plurality of input bits from a digital register. These input bits are coupled to capacitors that are weighted in powers of two. The output of the CCMDAC then depends on which input bits are on. The CCMDAC is an extremely low power digital to analog converter that generates a succession of comparison voltages for implementing the successive approximation algorithm of the analog-to-digital converter of the invention.

The capacitively-coupled successive approximation analog-to-digital converter of the invention includes a comparator that receives two inputs: one is the analog voltage input to be digitized; and the other is the CCMDAC output. The state of the digital register in the CCMDAC is controlled by a logic circuit that senses the output of the comparator indicating which of the two inputs is larger.

The digital register is initially set to be all zeros. The most significant bit (MSB) is then toggled and the first comparison is made. If the comparison shows that the CCMDAC output ($V_{MDAC}$) is greater than the analog input ($V_{in}$), then the MSB is set is to zero. The next significant bit is toggled and a new comparison is made. Again, if the $V_{MDAC}$ is greater $V_{in}$, that bit is set to zero. Otherwise, it is set to one. This process is repeated for n bits. During each iteration, the output of the capacitively-coupled multiplying digital to analog converter increments by a successively smaller amount (such as one-half) due to the coupling of additional, sequentially smaller, capacitors within it. This process is repeated for n bits. The result of n comparisons is n-bits of resolution.

Another embodiment of the invention uses a double sided converter to accommodate a differential input. This embodiment can improve the common-non-ideality mode rejection of the comparator. This embodiment couples each comparator input to a circuit comprising a CCMDAC, digital register, and logic circuit, as described in the previous embodiment. The two sides of the differential input are now used as clamp signals to upper and lower CCMDACs. One digital register holds the converted value and the other its two's complement value. This embodiment works for both positive and negative input signals; the first bit is interpreted as a sign bit. Offset can be digitally compensated by setting the input voltage to zero (both sides equal) and storing the results in digital output.

BRIEF DESCRIPTION OF THE DRAWING

These and other aspects of the invention will now be described in detail with reference to accompanying drawings, wherein.

DESCRIPTION OF THE PREFERRED EMBODIMENTS

Figure 1:
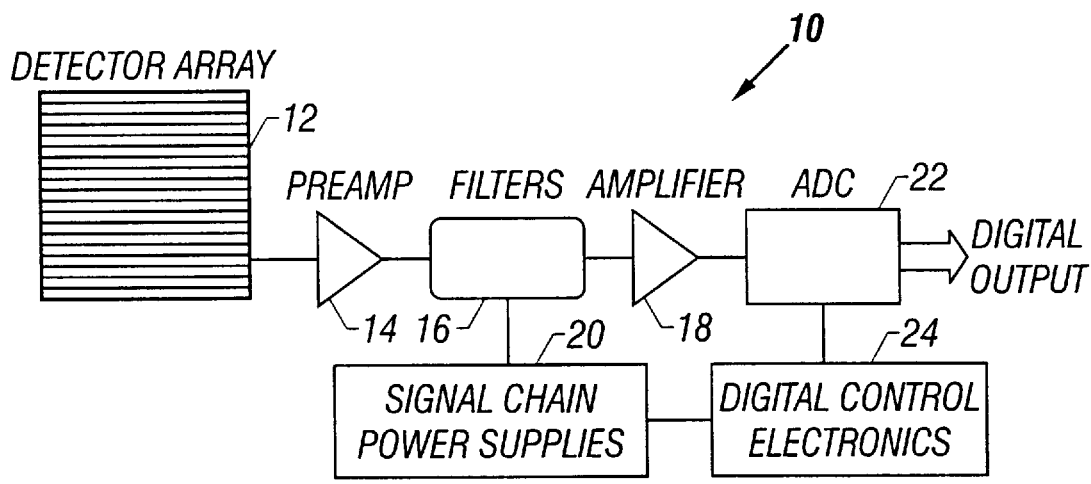
FIG. 1 shows a system signal chain for a focal-plane array imaging device with an off-chip analog-todigital converter.

FIG. 1 shows a conventional focal-plane array system with off chip analog-to-digital conversion. The focal-plane array system 10 includes a focal-plane array detector 12 which generates an analog output that is processed by a preamp 14, filter 16, and amplifier 18, all of which are powered by a plurality of power supplies 20. The output of the amplifier 18 is fed to a separate integrated circuit containing an analog-to-digital converter 22 which is controlled by a digital control electronics circuit 24.

Figure 2:
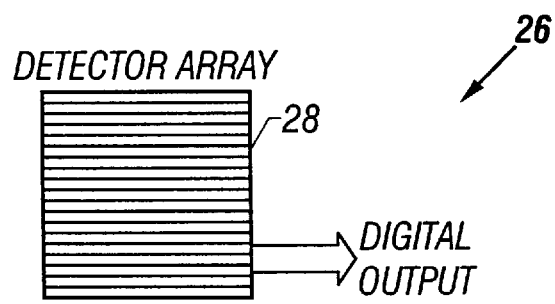
FIG. 2 shows a system signal chain for a focal-plane array with on-chip analog-to-digital converters.

The invention provides the many advantages of integrating analog-to-digital circuits onto a detector array chip by employing the configuration shown in FIG. 2. The invention provides a focal-plane array system 26 that includes a detector array 28 having on-chip analog-to-digital conversion.

The functional equivalent of all of the off-chip circuitry shown in FIG. 1 is now included on the detector array chip. As a result, the array 28 itself can produce a digital output directly.

Active pixel sensors ("APS") represent a new generation of image sensor structures which include associated image processing structure on the chip.

Figure 3:
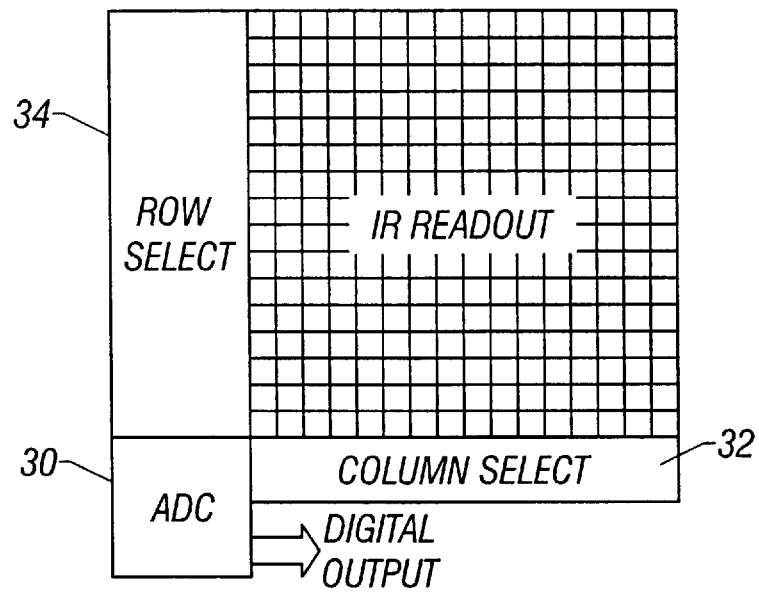
FIG. 3 shows the architecture for an on-focal-plane analog-to-digital converter employing serial architecture.

FIG. 3 shows one possible on-focal-plane analog-to-digital conversion architecture. It uses a serial analog-to-digital converter. This approach simply integrates a single analog-to-digital converter monolithically with readout electronics, including column select 32 and row select 34. However, this configuration cannot handle extremely high clock rates (such as one megahertz) without over-sampling techniques. High speed operation will also increase focal-plane power dissipation. Also, there is very little silicon area available for the high resolution analog-to-digital converter 30 that would be required with this architecture.

Figure 4:
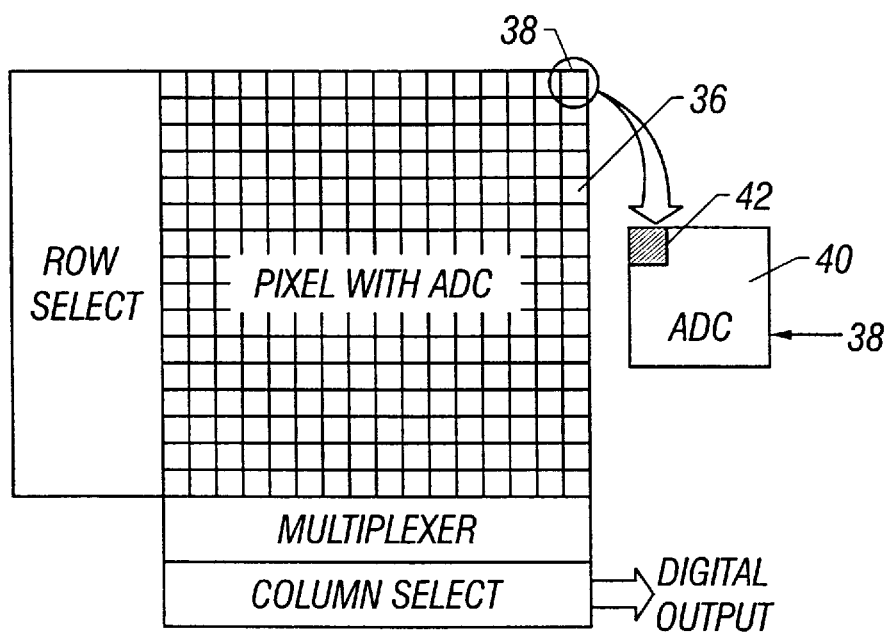
FIG. 4 shows an architecture for an on-focal-plane analog-to-digital converter employing a parallel architecture.

Another alternative is to employ a single analog-to-digital converter for each pixel, as shown in FIG. 4. Here, in the focal-plane array 36, each pixel 38 includes both the analog-to-digital converter 40 and the readout electronics 42. This may not be feasible given the relatively small area available for most applications where the pixel size is typically 30 $\mu m^2$.

Figure 5:
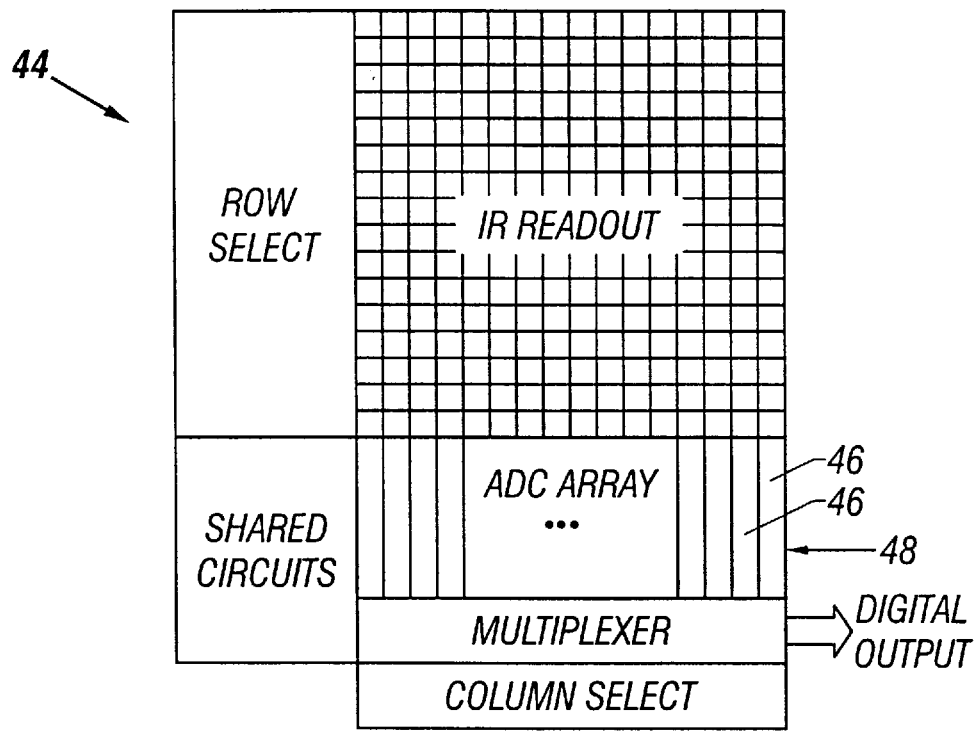
FIG. 5 shows an architecture for an on-focal-plane analog-to-digital converter employing column-parallel architecture.

The speed limitations of the serial architecture, and the area limitations of parallel architecture, can be mitigated by the use of a semi-parallel architecture such as the one shown in FIG. 5. The semi-parallel architecture focal-plane array system 44 employs individual analog digital converters 46 for every column of the readout. These individual analog-to-digital converters (ADCs) 46 form an analog-to-digital converter array 48. This design affords virtually unlimited chip area in one dimension and tight but feasible design space in the other dimension.

These ADCs 46 operate in parallel on a row of image data at a time. The conversion rate in this case is the row readout rate, which is 100–1,000 times slower than the serial pixel data rate. For example, for a 1,024 by 1,024 array having a serial pixel data rate of 50,000 pixels per second, the corresponding ADC data rate for a one ADC per column architecture would be just 50 pixels per second.

One alternative semi-parallel architecture is to employ a single ADC for multiple columns, where the number of columns sharing an ADC is small, such as 32. This derivative architecture would require submultiplexing of the multiple columns to the ADC. This affords more design area in the transverse direction at the expense of increased data rate.

Semi-parallel architecture also affords relatively low power operation. This is due to the fact that, unlike digital circuits, power dissipation in analog circuitry depends super-linearly on the operating frequency. As a result, the total power dissipation for a semi-parallel architecture can be lower than for a serial architecture for the same pixel data rate.

Additionally, the semi-parallel architecture allows the use of "share circuits", i.e., a single circuit block (e.g. reference generator) can serve the entire ADC bank. This can also lead to considerable power and area saving. Since the conversion rate is much lower than that in a serial architecture, the analog circuits may be biased in sub-threshold, affording further reduction in power. One concern, however, is the matching of the ADC characteristics between the columns. A lack of matching can generate fixed-pattern noise in the output data. Fixed pattern noise can be reduced by using off-chip data processing techniques.

The present invention employs a successive approximation algorithm for implementing on-chip ADC. The successive approximation concept is well known in the art. In general it works as follows by making incremental guesses, where each guess is incremented by $\frac{1}{2}^n$ where n is the iteration number. For example, if it is desired to convert an analog voltage between zero and one volt to a digital signal, a guess of one-half volt is made. That value is compared against the input. If the input is 0.7 volts, a higher guess should be made. The next guess would be one-half (the old guess) plus one-fourth volts ($\frac{1}{2}^{n-2}$ or 0.75 volts. This is too high. So the next guess is one-half plus one-eighth ($\frac{1}{2}^3$) volts, or 0.125 volts. This is still too low, so the next guess is one-half plus one-eighth plus one-sixteenth volts ($\frac{1}{2}^4$), or 0.175 volts. Again, this is too low so the next guess is one-half plus one-eighth plus one-sixteenth plus one-thirtysecond ($\frac{1}{2}^5$). Each iteration represents one bit resolution. This process continues until the desired number of bits is readout.

There are many ways to implement successive approximation. Chip area and power are a paramount concern for image sensor applications. With the present invention, the inventors have found a technique for implementing successive approximation analog-to-digital conversion in a manner which utilizes minimal chip area and power. Thus it is particularly well suited to image sensor applications. It is particularly well suited for a column-parallel architecture having an analog-to-digital converter array on-chip, where the analog-to-digital converter processes data from one or more columns.

Figure 8:
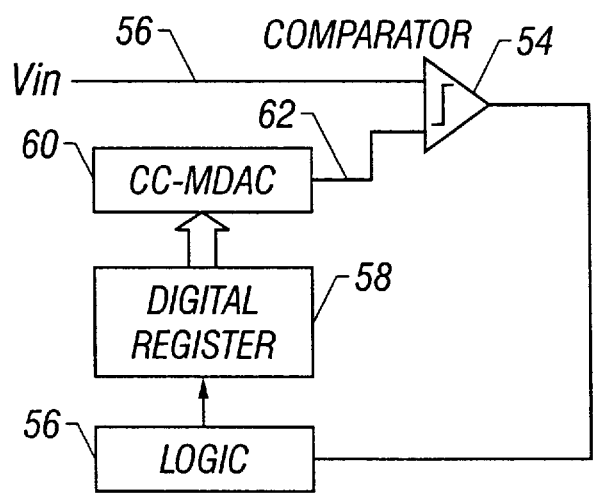
FIG. 8 shows a capacitively-coupled successive approximation analog-to-digital converter in accordance with the invention.

FIG. 8 shows a capacitively-coupled successive approximation analog-to-digital converter 50 of the invention. The input voltage to be converted Vin 52 is sent to one input of a comparator 54. A logic circuit 56 determines a specific digital code which is sent to a digital register 58 in accordance with the techniques of the present invention.

The digital register 58 sends a digital code, for example, a four bit code, to a capacitively-coupled multiplying digital to analog converter 60. This digital to analog converter 60, in response to the code from the digital register 58, sends an appropriate analog level voltage 62 to a second input to the comparator 54. This analog signal 62 is used for the above-discussed iteration made in the successive approximation algorithm.

The comparator 54 determines whether the Vin 52, or the digital to analog converter output 62, is larger. It transmits this information to the logic unit 56, which makes the appropriate modification to the digital register 58.

Figure 6:
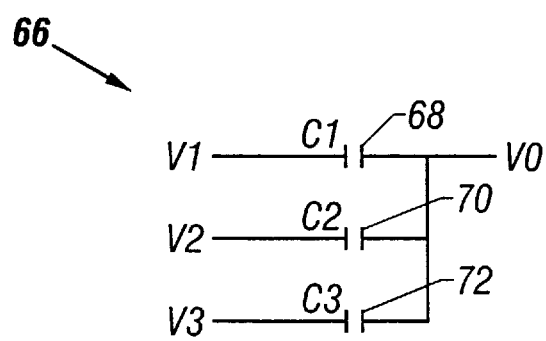
FIG. 6 shows a capacitor network demonstrating capacitive coupling.
Figure 7:
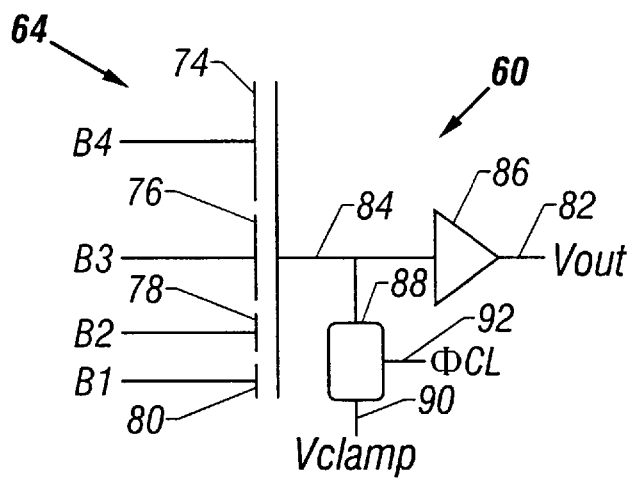
FIG. 7 shows a capacitively coupled multiplying digital to analog converter in accordance with the invention.

The capacitively-coupled multiplying digital to analog converter (CCMDAC) 60 is shown in more detail in FIG. 7. The CCMDAC 60 includes a capacitor network 64. FIG. 6 shows the general operation of a capacitor network 66. The capacitor network 64 comprises three capacitors, in this example capacitors 68, 70 and 72 having capacitance values of C1, C2 and C3 respectively. Each capacitor 68–72 receives a voltage input, V1, V2 and V3 respectively. The total capacitance of the network 66 is C1+C2+C3. The output of the capacitor network is $V_o$. A change in voltage V1 results in a change in $V_o$. according to the expression:

$$\Delta V_o = \Delta V1 \times [C1/(C1+C2+C3)]$$

In fact, any change in V1, V2, or V3 results in a change in $V_o$ according to the expression:

$$\Delta V_o = (\Delta V1 C1 + \Delta V2 C2 + \Delta V3 C3)/(C1+C2+C3)$$

Input voltages are hence weighted by the size of the input capacitor. These weighted input voltages are summed using this circuit.

The CCMDAC 60 shown in FIG. 7 has four capacitors 74, 76, 78, and 80. Each of these capacitors receive an input bit B1, B2, B3 and B4. Thus, the output $V_{out}$ of the CCMDAC 60 depends on the value of B1–B4 and of C1–C4. The capacitors attached to these input bits are weighted in powers of two. In the preferred embodiment, input bit B2 is connected to capacitor 78, which is twice as large as capacitor 80, which is attached to input bit B1. Likewise, capacitor 76 is twice as large as capacitor 78 and capacitor 74 is twice as large as capacitor 76.

This configuration allows the CCMDAC 60 to receive a four bit binary word and respond with a output voltage $V_{out}$ 82 that can be determined with four bit resolution. The output 84 of the capacitor network is amplified by amplifier 86. Also the capacitor network output 84 is coupled to a voltage source $V_{clamp}$ 90, switched by clamping switch 88, controlled by clamp signal 92 ($\Phi_{cl}$).

It is assumed that the total capacitance of all the bit inputs is large compared to any stray capacitance. The bit input voltages B1–B4 vary between a logic low level (assumed for simplicity to be zero, or ground), and a high level $V_{high}$, that is adjustable. The output voltage $V_o$, is an amplified version of the floating node voltage attached to the clamping switch 88. The amplifier 86 gain A is taken to be unity for simplicity. At time zero, all input bits are at logic low and the clamping switch 88 is pulsed by means of clamping switch signal 92. This sets the network output voltage 84 (floating node voltage) and the output voltage 82 to approximately $V_{clamp}$. Assuming that $B_N$ is zero for a logic low and one for a logic high, the output voltage can be expressed by:

$$V_{out} = A[V_{high}(B1+2B2+4B3+8B4)+V_{clamp}]$$

where A is amplification gain of the amplifier 86. Thus, the logic high level $V_{high}$ is multiplied by the digital word having the input bits B1–B4. $V_{out}$ is the CCMDAC 62 output shown in FIG. 8.

The CCMDAC 60 can be used in other applications to generate voltages with extremely low power, such as in image chips or in other mixed analog/digital signal processing chips. For example, a simple ramp generator can be made by connecting the output of a simple counter to the output of the CCMDAC. Alternatively, a non-linear ramp can be made by mapping the output of the counter to transform digital values to generate a quadric, exponential or logarithmic output. The capacitors need not be sized in powers of two, or in any regular geometric series.

In operation, the capacitively-coupled successive approximation analog-to-digital converter (CCSA-ADC) 60, shown in FIG. 8 compares the input voltage 52 against a succession of voltages 62 generated by selecting inputs to the CCMDAC 60. Initially, the digital register 58 is set to all zeros. The most significant bit (MSB) is then toggled and the first comparison takes place. In FIG. 7 this would correspond to an input bit B4 at capacitor 74 and no inputs to B1–3, capacitors 76, 78 and 80. If the comparison made by comparator 54 is that $V_{MDAC}$ is greater than $V_{in}$, then the MSB is set to zero, the guess is too high. The next significant bit is toggled, and a new comparison is made. If $V_{MDAC}$ is greater than $V_n$, that bit is set to zero. If $V_{MDAC}$ is less than $V_n$, that bit is set to one and the next significant bit is toggled and a new comparison made. This process is repeated for n-bits to achieve n-bits resolution.

If the input is a differential input, one "side" can be used as a V-clamp assuming the other "side" goes through the same gain stage before the comparator.

Figure 23:
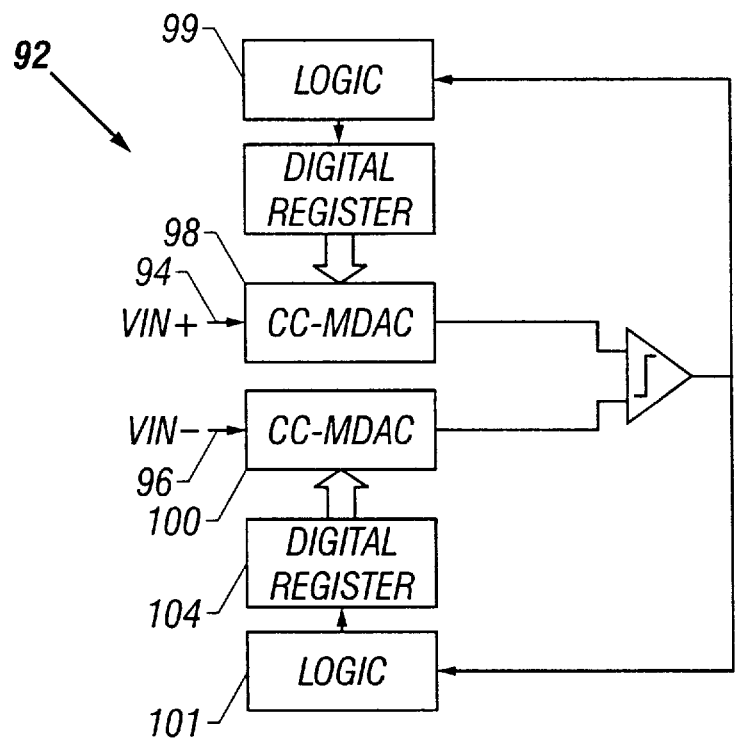
FIG. 23 shows a capacitively coupled successive approximation analog-to-digital converter in accordance with a second embodiment of the present invention.
Figure 24:
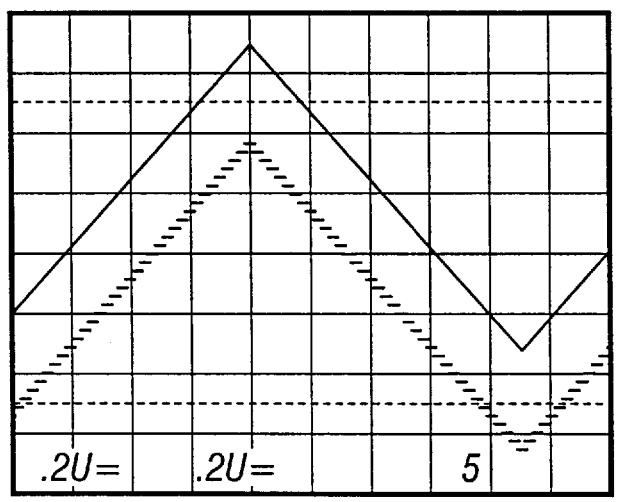
FIG. 24 shows an input verses output waveform for the analog-to-digital converter of FIG. 23.

Comparators are usually non-ideal and have an offset voltage. The offset voltage might be reduced through better comparator design. Another approach is to measure the offset by a applying a known voltage to the input, and then storing the digital output as the offset. This offset can either be included in the input digital logic to produce a compensated digital input to the CCMDAC, or can be read out along with the converted signal and digitally processed later. An embodiment of the present invention which improves the common-non-ideality mode rejection in a double sided converter as shown in FIGS. 23 and 24.

Figure 9:
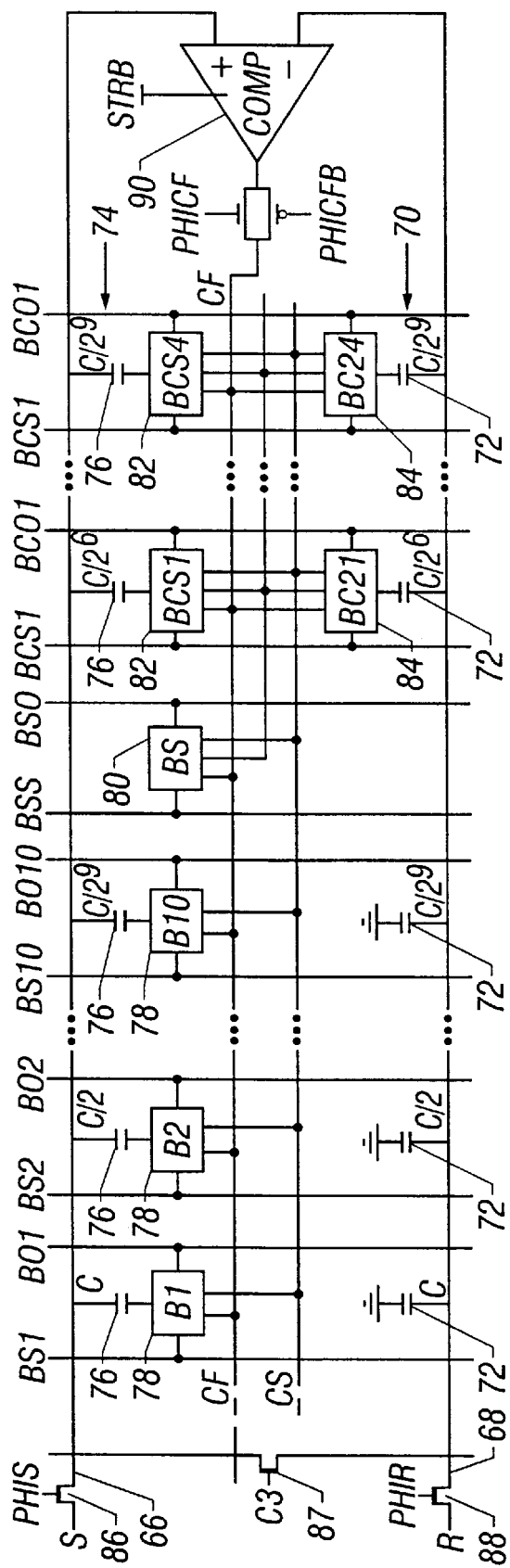
FIG. 9 shows a block diagram of a preferred embodiment of the capacitively-coupled successive approximation analog-to-digital converter of FIG. 8.

FIG. 9 shows a block diagram of a preferred embodiment of the CCSA-ADC 60 shown in FIG. 8. This ADC circuit 64 is designed to have ten conversion bits and four correction bits for compensating the DC offset at the input of the comparator as discussed above. A sign bit controls the correction operation after all the bits have been readout, and provides the control signal to activate the sample or the reset side of the correction bits according to its value.

The ADC 64 includes sample and reset signals 66, 68; a reset capacitor bank 70, comprised of individual capacitors 72; a sample capacitor bank 74, comprised of capacitors 76; a plurality of bit cells, including ten conversion bits 78; a sign bit cell 80; and four correction bits, including four sample correction bits 82, and four reset correction bits 84. A crowbar switch 87 is connected across the sample and reset lines 66 and 68 each which include a sample switch 86 and reset switch 88. A strobed comparator 90 receives inputs from either the reset or sample capacitor banks and makes a determination which input is larger. The comparator 90 output then is sent to a shift register 92 which controls the conversion operation as discussed in more detail below. An output shift register 94 stores the digital words comprising the output of the ADC 64.

Figure 10:
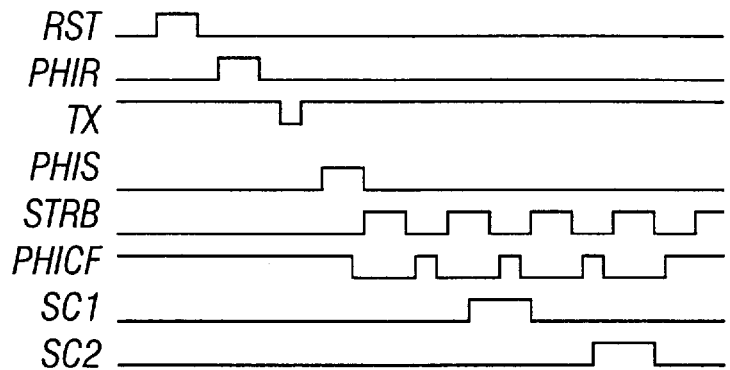
FIG. 10 shows a clock diagram of the circuit operation of the analog digital converter of the FIG. 9.

The operation of this converter is controlled by using the clock scheme shown in FIG. 10. After one row in the focal-plane array is selected, each ADC (such as the ADC 46 shown in FIG. 5) will readout one pixel in the row at a time. All the bit cells in the ADC 64 in this embodiment are reset at the same time as the pixels in the row of the focal-plane array are reset. This ensures that the bottoms of all the capacitors in the reset and sample capacitor banks are connected to ground. This occurs in FIG. 10 at the signal labeled RST. Next, the pixel reset level 68 (PHIR) is sampled onto the reset capacitor bank, and the signal level 66 (PHIS) onto the sample capacitor bank, after the transfer gate (TX) of the sensor pixel in the focal-plane array dumps the charges out to the signal chain.

Once the analog charge readout is finished, the strobed comparator 90 is then activated to start the conversion process. The sample and reset levels, the latter being higher due to the specific source follower scheme, are fed into the comparator in such a way that the output of the comparator for the first strobe cycle is a logic high. This high will then be read into first bit cell (MSB) 78 as it is being selected by the shift register scanner in the bit cells. This forces the bottom of the bit capacitor to $V_{ref}$, which is usually the saturation of the signal level relative to the reset level, in this case about 1.2 volts.

As a result, the sample level is charged up by one-half Vref. The second comparison between the reset and sample level is then performed by the comparator 90 in the second strobe cycle, resulting in an output of logic high (low) if the sample level is lower (higher) than the reset level. This new logic output is directly fed into the MSB cell 78 (labeled B1). This logic output resets the voltage at the bottom of the capacitor to ground if it is low, or keeps it to be Vref if it is high.

The cell is then disconnected from the comparator feed back line and the logic input is stored in the bit cell. It keeps the bottom of the capacitor connected to the right voltage (either ground or Vref) while waiting to be readout parallelly with other bits when the column is being selected by the column addressing signal.

The next two strobe cycles are then used for the second bit conversion in the same way: the first cycle is used for setting the voltage of bottom of the second bit capacitor (C/2) to Vref; and the second cycle for resetting it according to whether the sample level has exceeded the reset level. This process continues until the ten bit conversion is finished for all the conversion bits B1–B10.

To get the offset correction bits, the crowbar switch 87 is switched on, so that sample and reset lines 66, 68 have the same potential. The first output of the comparator 90 is stored in the sign bit cell 80 which serves as a flag for the following four correction bits 82 (labelled BCS1–BCS4), indicating whether they should be subtracted (if it is zero), or added (if it is a one) to the original ten bit data. The design technique of the invention is to always raise up the voltage on the lower voltage side and then do the comparison. This is why two correction bit cells 82, 84 are used for each correction bit, since the threshold voltage mismatch between the two input transistors of the comparator 90 is unknown.

The sign bit 80 activates the unit cells at the lower voltage side while they leave the other side as they were when reset at the beginning. The extra clock PHICF is needed to cut off the comparator feedback while the comparator resets prior to each comparison. It can be simply the inverted clock from STRB. However, an improved result is expected if the feedback is cut off a little before the comparator 90 resets and switch on a little after the reset is finished. In the test chip described below, the clock inputs are laid out separately.

Figure 11:
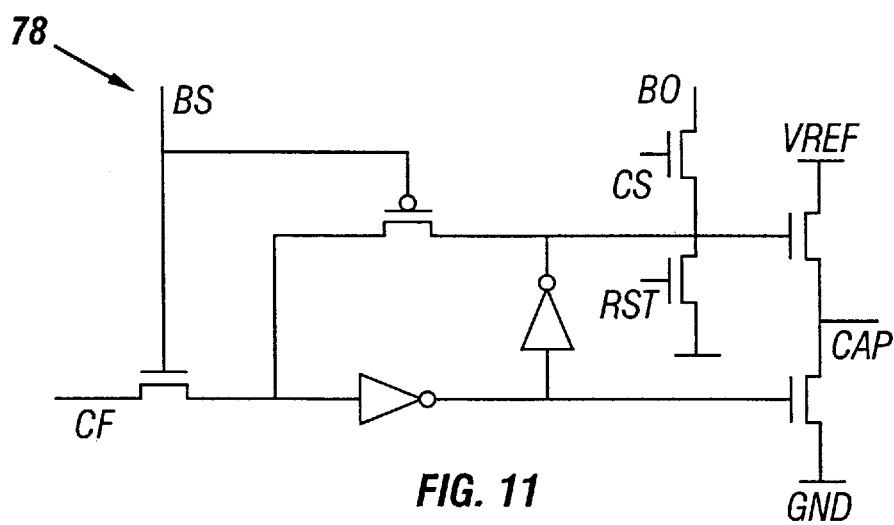
FIG. 11 shows a unit bit cell used for conversion bits in the analog-to-digital converter of FIG. 9.

Each unit cell 78, 80, 82, 84 in the ADC 64 is a conventional latch with its inverted end and non-inverted signals controlling the switches to set the voltages at the bottoms of the capacitors. FIG. 11 shows a schematic of a circuit for carrying out this operation. To save chip area, the signal MOS transistors are adopted for all the switches for this design. Better operation is expected if the complimentary switches are used (as shown in the embodiment of FIG. 23) for setting the capacitor voltages. The size (aspect ratio), of all the MOS transistors is 3/2, and that of the PMOS transistors is 6/2.

Figure 12A:
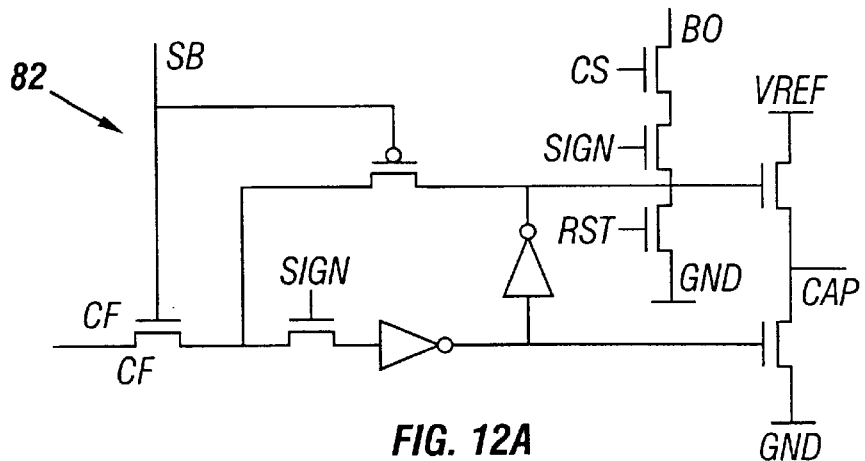
FIG. 12 shows a unit bit cell for correction bits in the analog digital converter of FIG. 9.
Figure 12B:
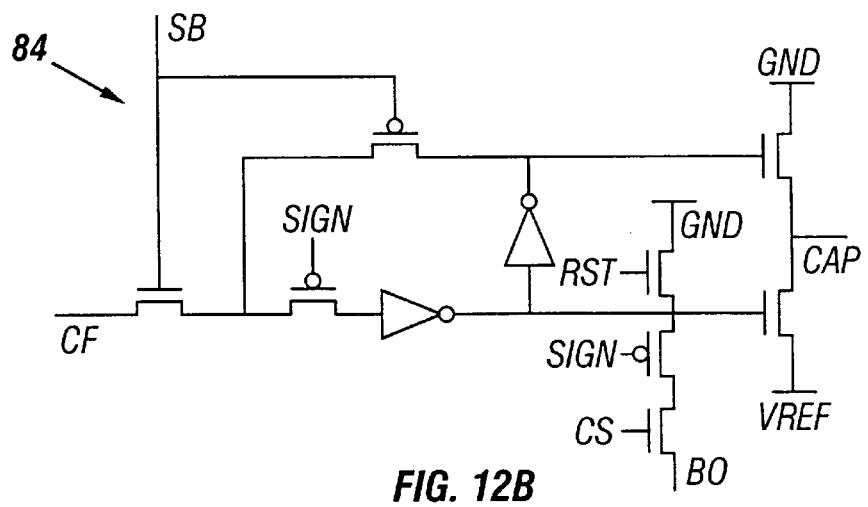

The unit cell design for the sign bit 80 is similar to the unit cell 78. The switches to set the capacitor voltages are not needed since the capacitors are not needed. The correction bit unit cells 82, 84 are formed by adding two switches at the input and output of the latch. If the sign (inverted sign) signal is used to control these switches, NMOS (PMOS) transistors should be used for the sample side bit cells 82 and PMOS (NMOS) for the reset side cells 84. In the test chip described below, the sign signal is used for the side selection (shown in FIG. 12). For reset side cells FIG. 4B, the output is taken from the first invertor, since in this case, as opposed to the sample side, a low output from the comparator indicates a lower voltage on the reset signal line.

Figure 13:
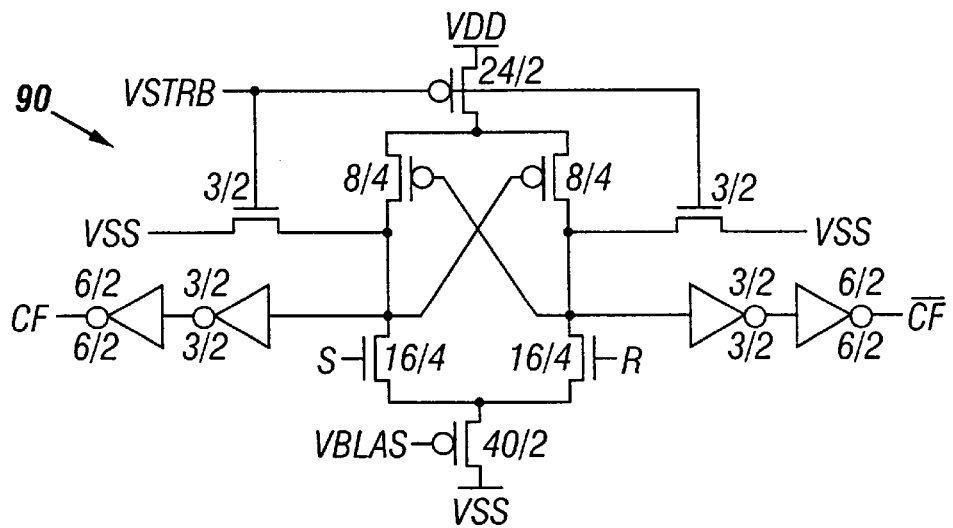
FIG. 13 shows a circuit diagram of a strobed comparator used in the analog-to-digital converter of FIG. 9.

FIG. 13 shows the strobed comparator 90 used with the ADC 64. The operation of the comparator needs a reset before each comparison. This strobe operation insures that both output nodes of the comparators start with zero voltage for each comparison so that the bias condition can always switch the transistors on, to enable the positive feedback, this will also push the comparator to the state determined by the differential input.

Figure 14:
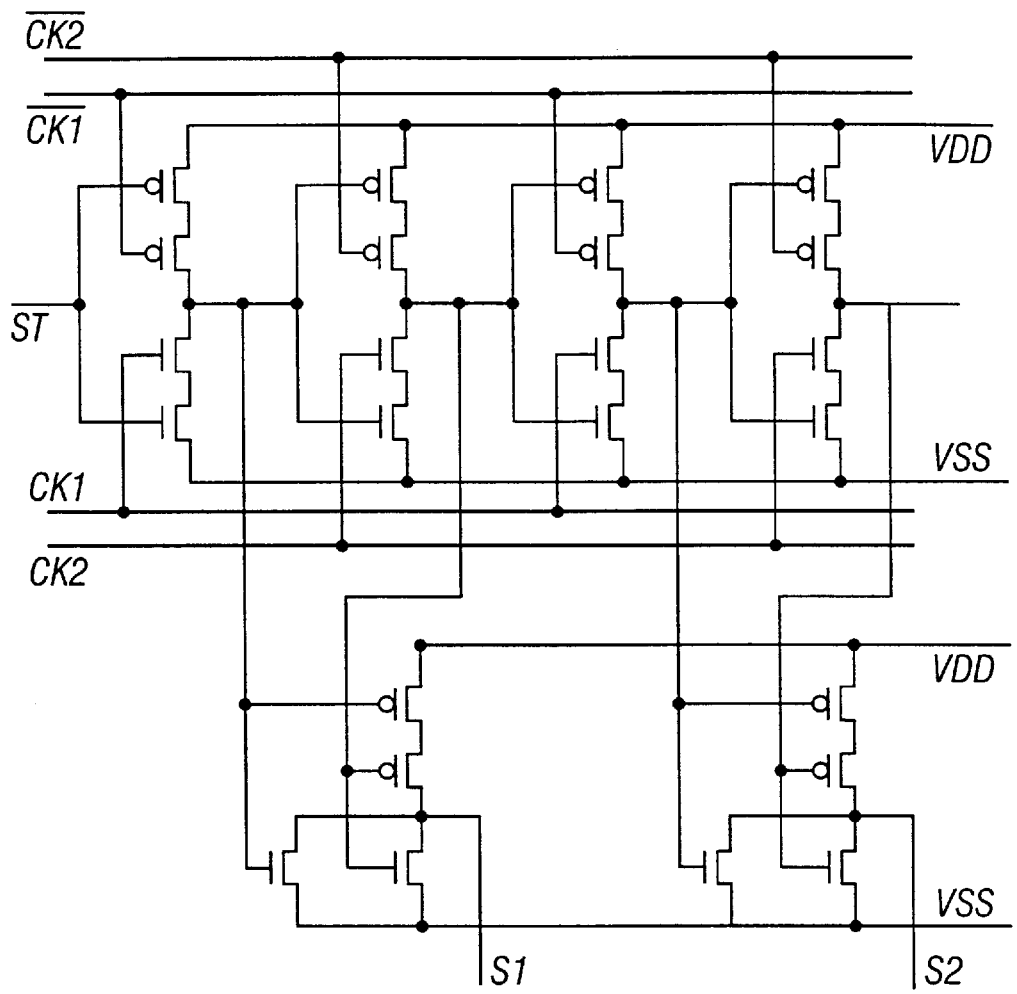
FIG. 14 shows a design of a shift register scanner used with the analog digital converter of FIG. 9.
Figure 15:
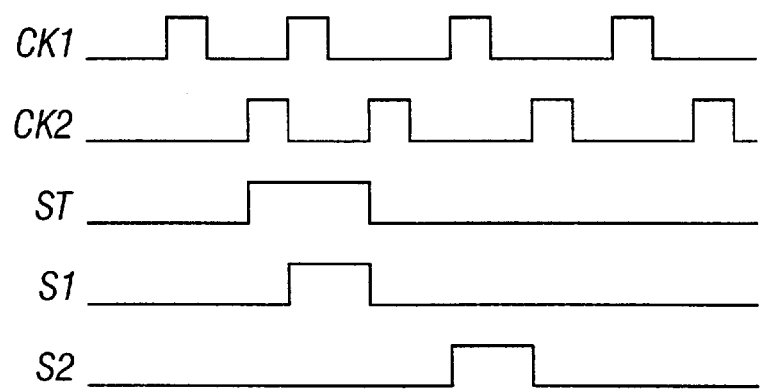
FIG. 15 shows a clock diagram of the circuit operation for the shift register scanner of FIG. 14.

The bit cells in the ADC 64 are scanned from MSB to LSB by a shift register type scanner in the bit cells. A dynamic design of the shift register is used, which requires two clocks to control the progress of the scan and one triggering signal to start the scan. One bit cell in the scanner has two clock converters and one NOR gate. FIG. 14 shows the design of the shift register and FIG. 15 is a flowchart explaining its operation. ST is the starting trigger pulse that loads a one into the shift register; S1 corresponds to BS1 in FIG. 9; and S2 corresponds to BS2 in FIG. 9. After the shift register is started, the rising edge of CK1 makes the first bit cell selected by an output high at that cell address and the following rising edge of CK2 deselects the cell by making the output low again. The next clock cycle does the same operation to the second bit cell and so on. The output of the shift register selects which bit of the capacitor bank is selected. The size (aspect ratio) of the NMOS transistors is 10/2, and that of PMOS transistors is 20/2.

Figure 16:
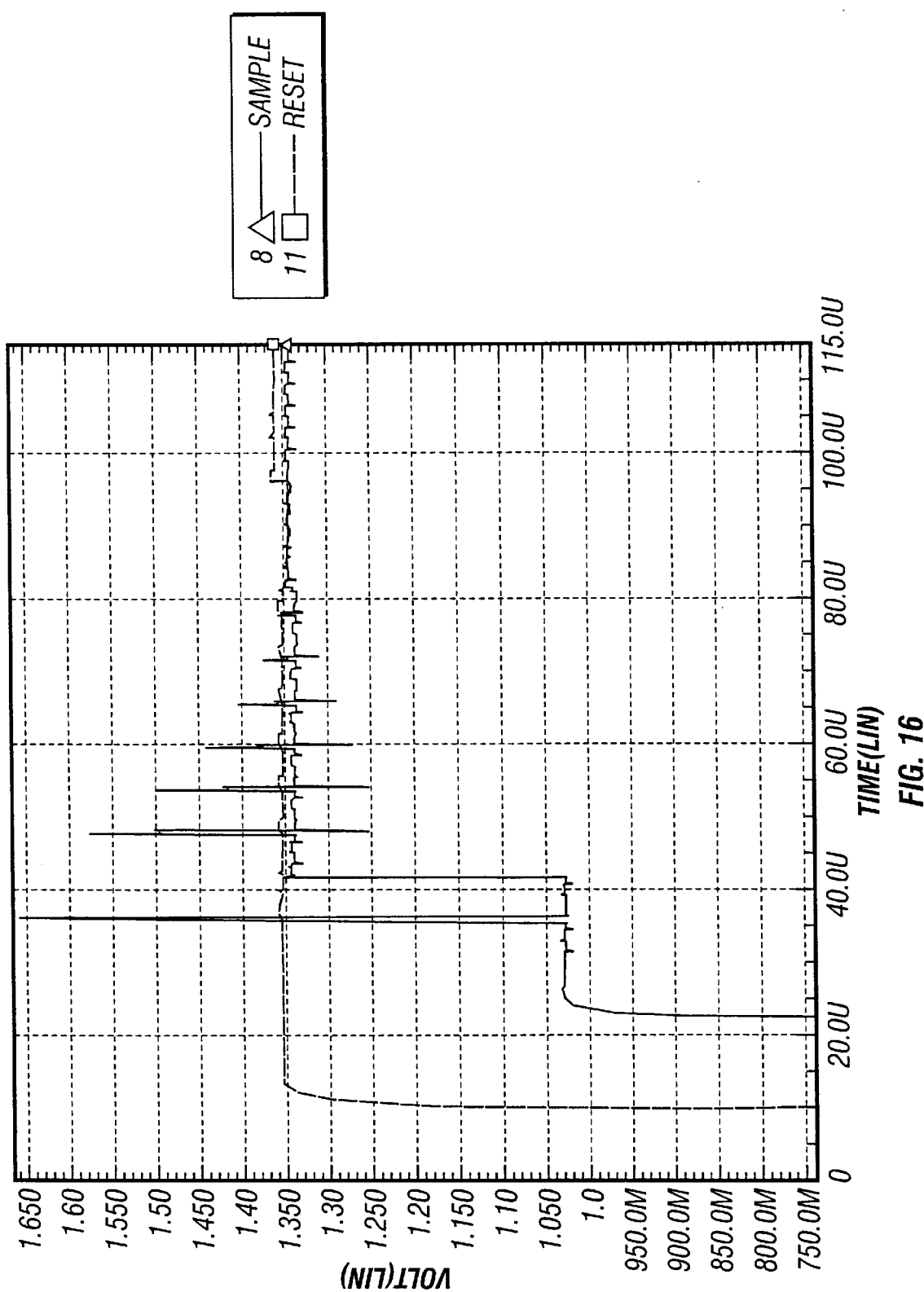
FIG. 16 shows a typical output waveform of the analog-to-digital converter of FIG. 9.

FIG. 16 is a printout of simulated output waveforms. The sample line voltage is set high to the proper level once a bit is activated and will be held on that level if the sample level is still lower than the reset level after being set high, or otherwise reset back to the initial level. Simulation was carried out intensively for checking the correction bits.

Figure 17A:
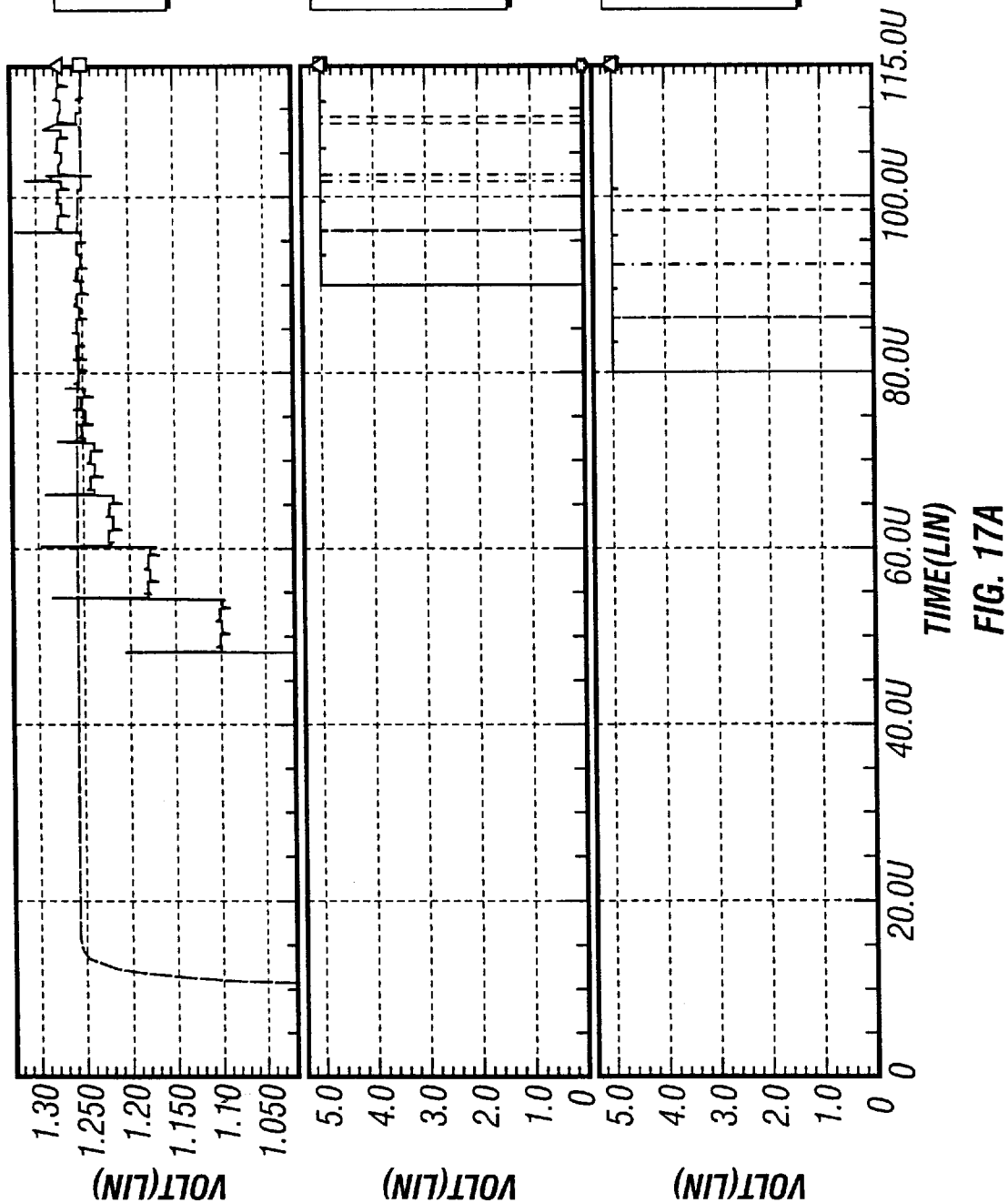
FIGS. 17A–B show correction bits for a simulation of the analog-to-digital converter of FIG. 9.
Figure 17B:
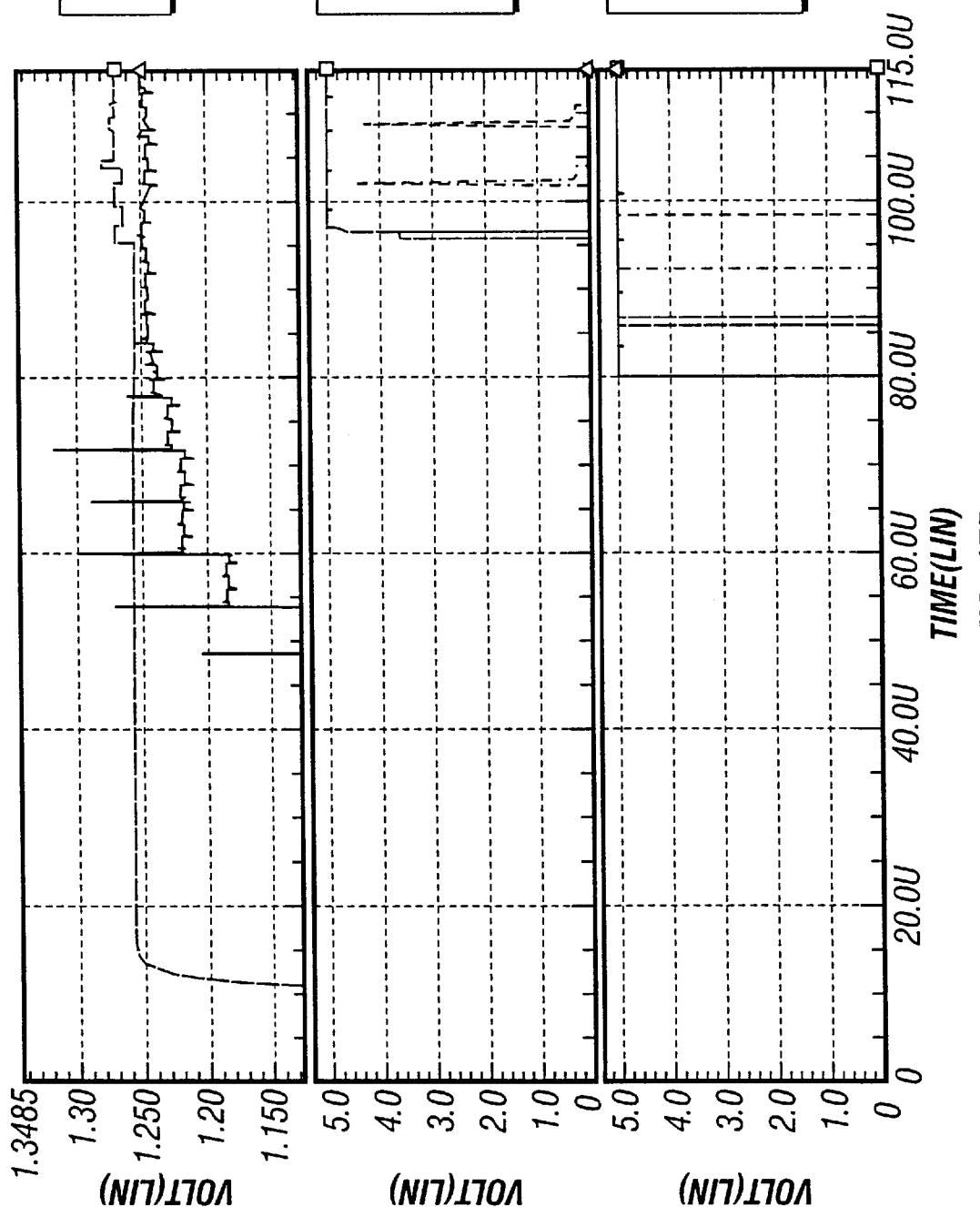
Figure 18A:
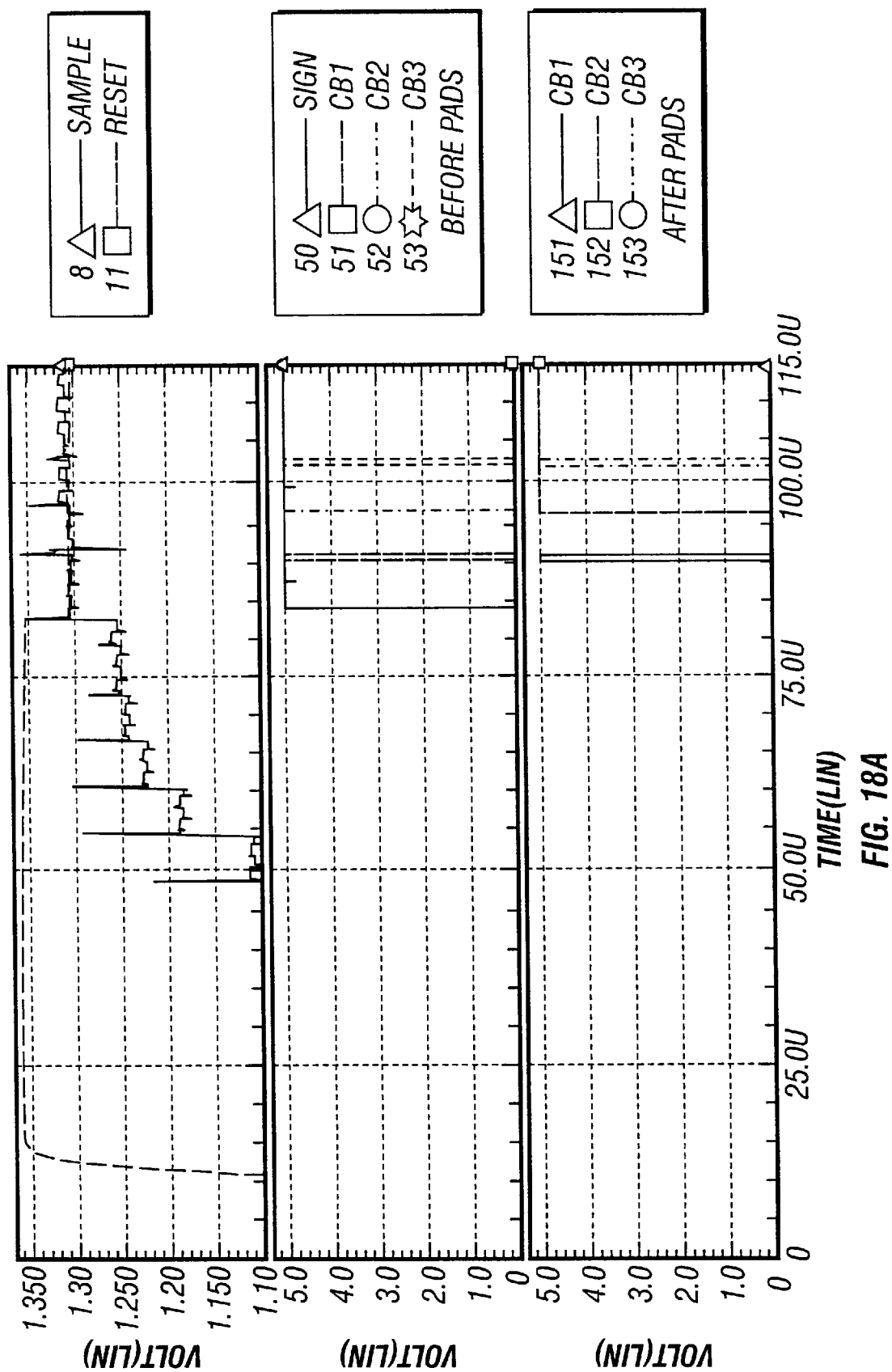
FIGS. 18A–B show correction bits for a simulation of the analog-to-digital converter of FIG. 9 including connections to the driving shift register column selection transistors and output pads.
Figure 18B:
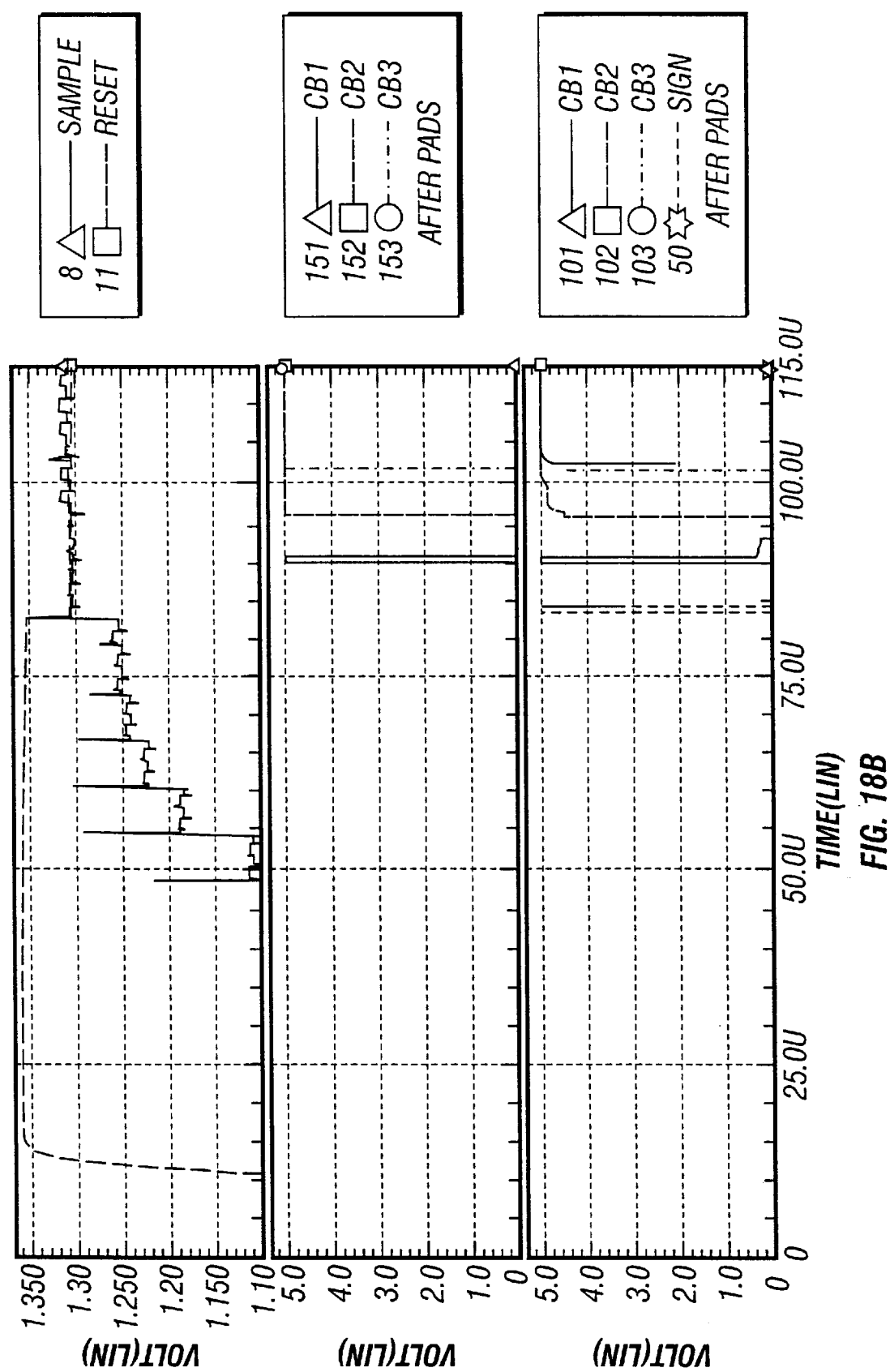
Figure 19:
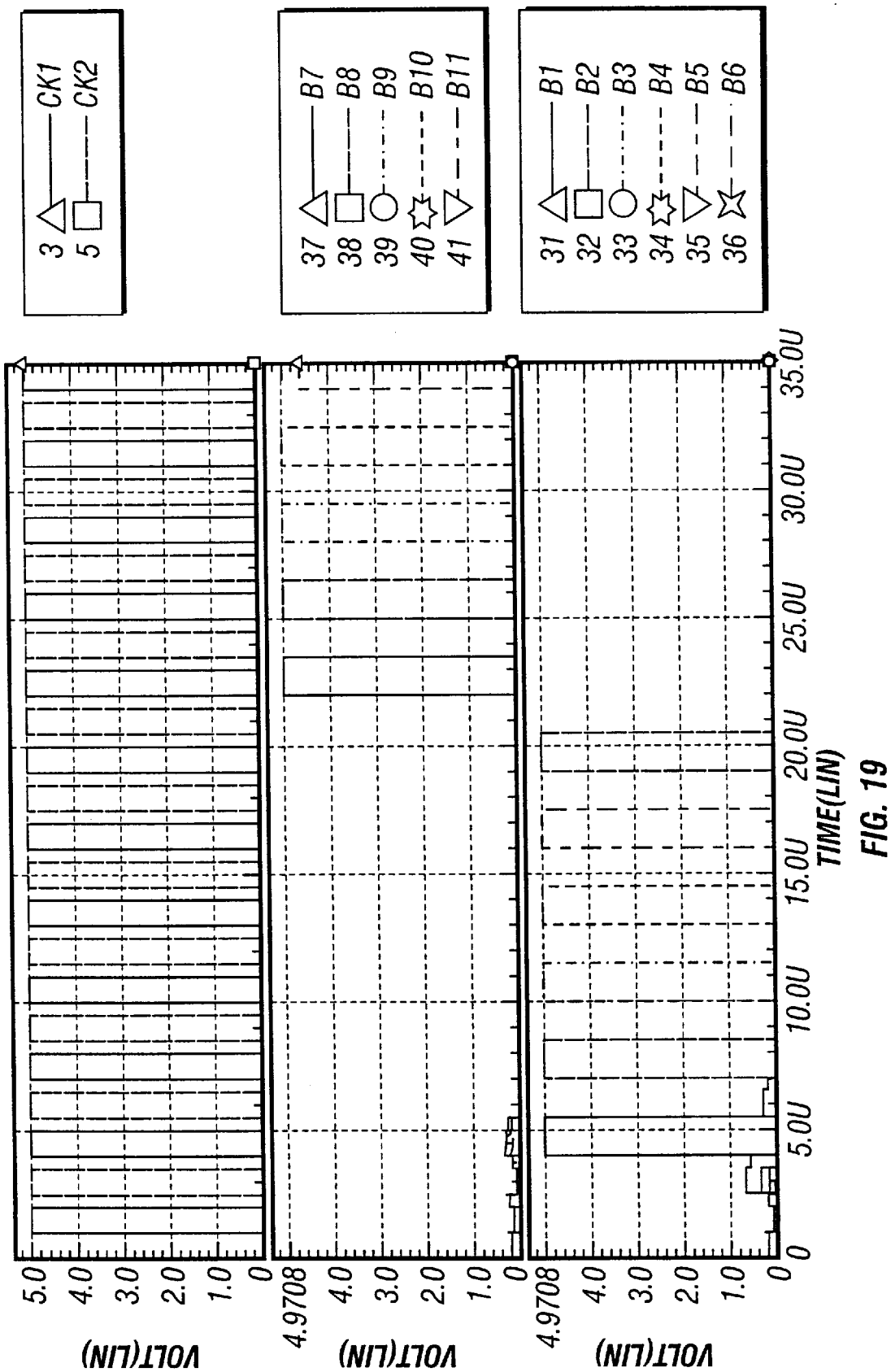
FIGS. 19a and 19b show the resulting correction bits for a simulation of an output weigh form from the shift register without load.

FIGS. 17A and B show the sample results without connecting the driving shift registers, the column selection transistors and the output pads. FIGS. 18A and B are the results after finishing all the connections including the shift register driver. The shift register was also simulated and the output waveform is shown in FIG. 19.

Figure 20:
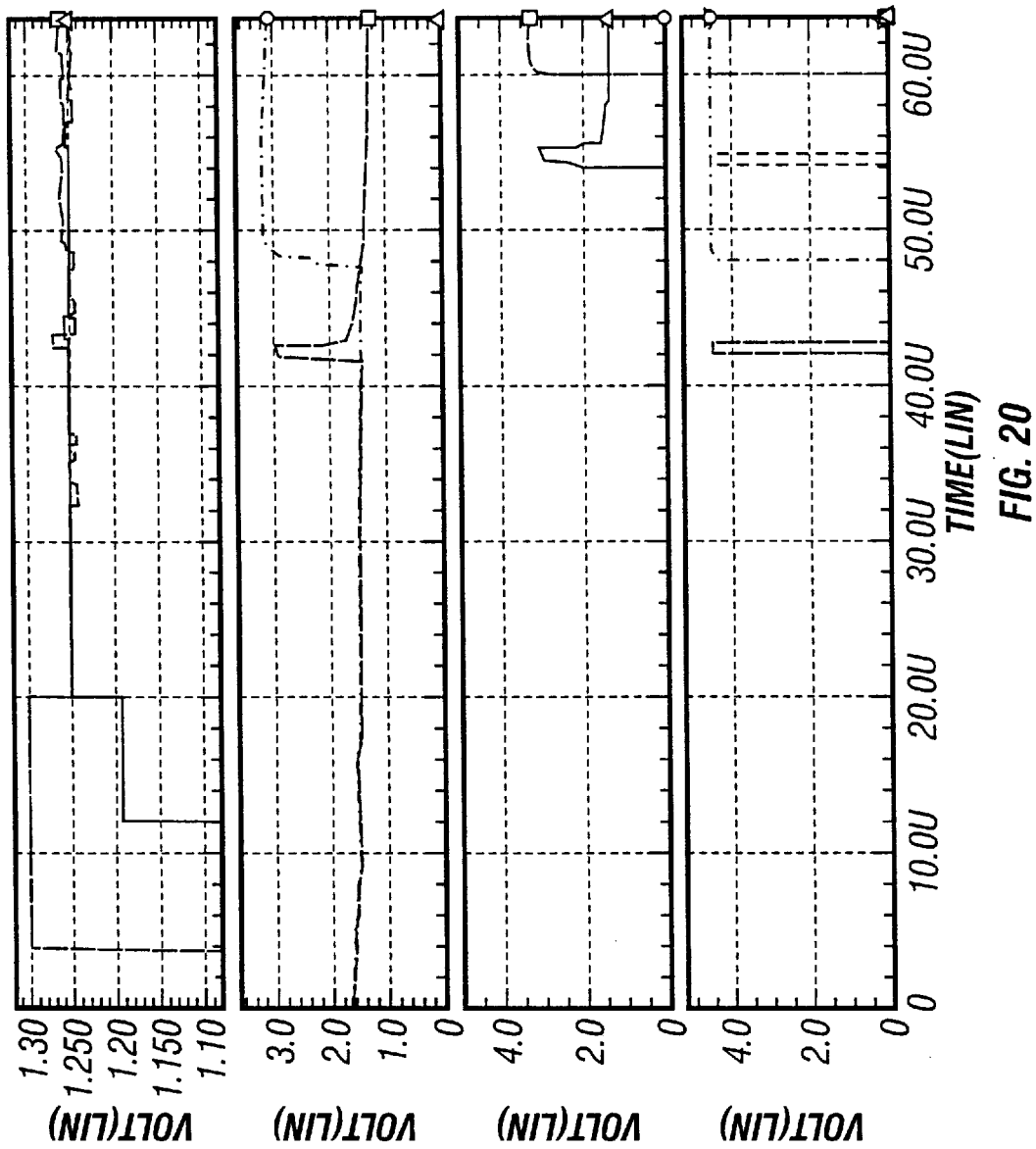
FIG. 20 shows a printout for the simulation of the complete correction bit operation for the analog-to digital converter of FIG. 9.

FIG. 20 is a printout of the simulation of the complete correction bit operation. The first row shows the sample and reset line voltages, the second and third rows show the bit outputs before the pads, and the fourth row shows outputs after the pads.

Both a complementary and single NMOS switching scheme was considered in the simulation. The results show that single NMOS transistors can be used for Vref and GND switches to the capacitors.

Figure 21:
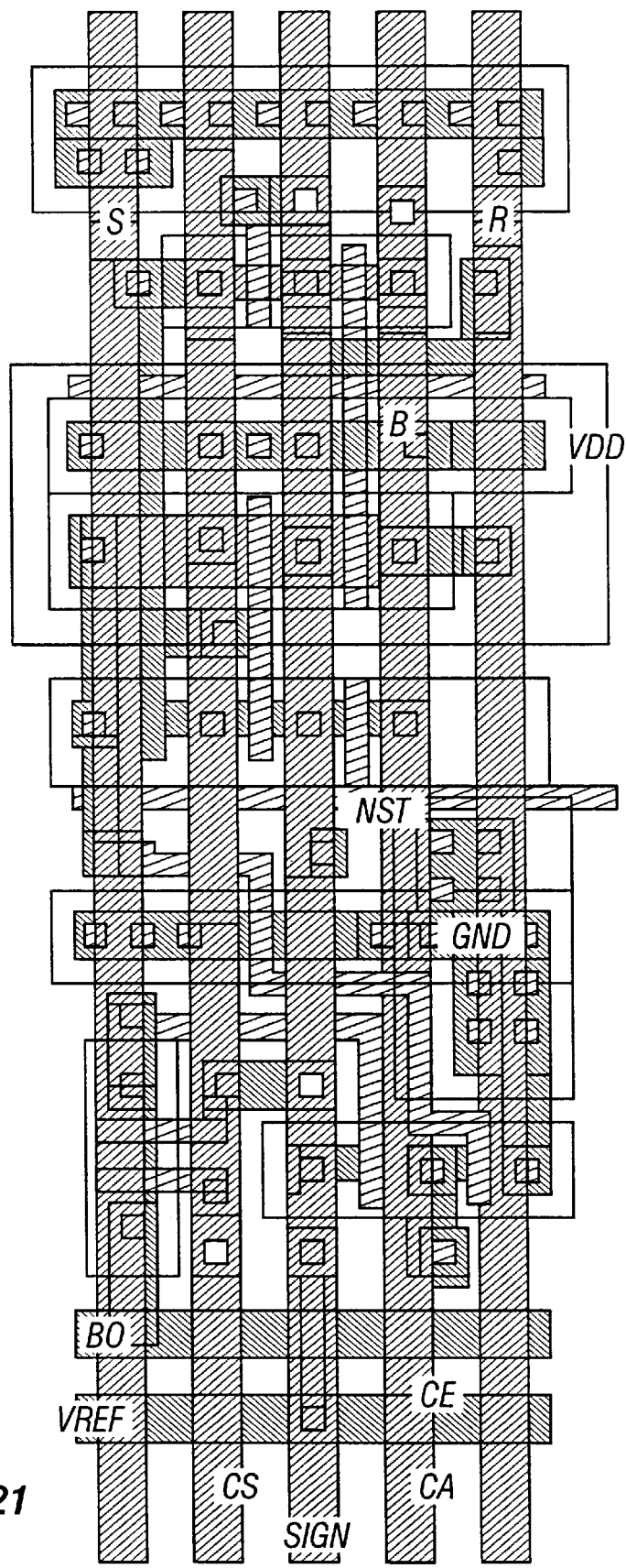
FIG. 21 is a layout of a correction bit cell.

The A/D converter is laid out, in the column width of 40 $\mu$m using MOSIS double poly, double metal 1.2 $\mu$m n-well design rules. Four metal-two wires run vertically in the column for the sample line, reset line, comparator feedback and column selection. In addition, one wire for the "sign" control signal in the correction bits is added. This brings the vertical wires to the maximum number for a 40 $\mu$m pitch design. As a layout example, FIG. 21 is a printout of the sample correction bit cell.

Figure 22:
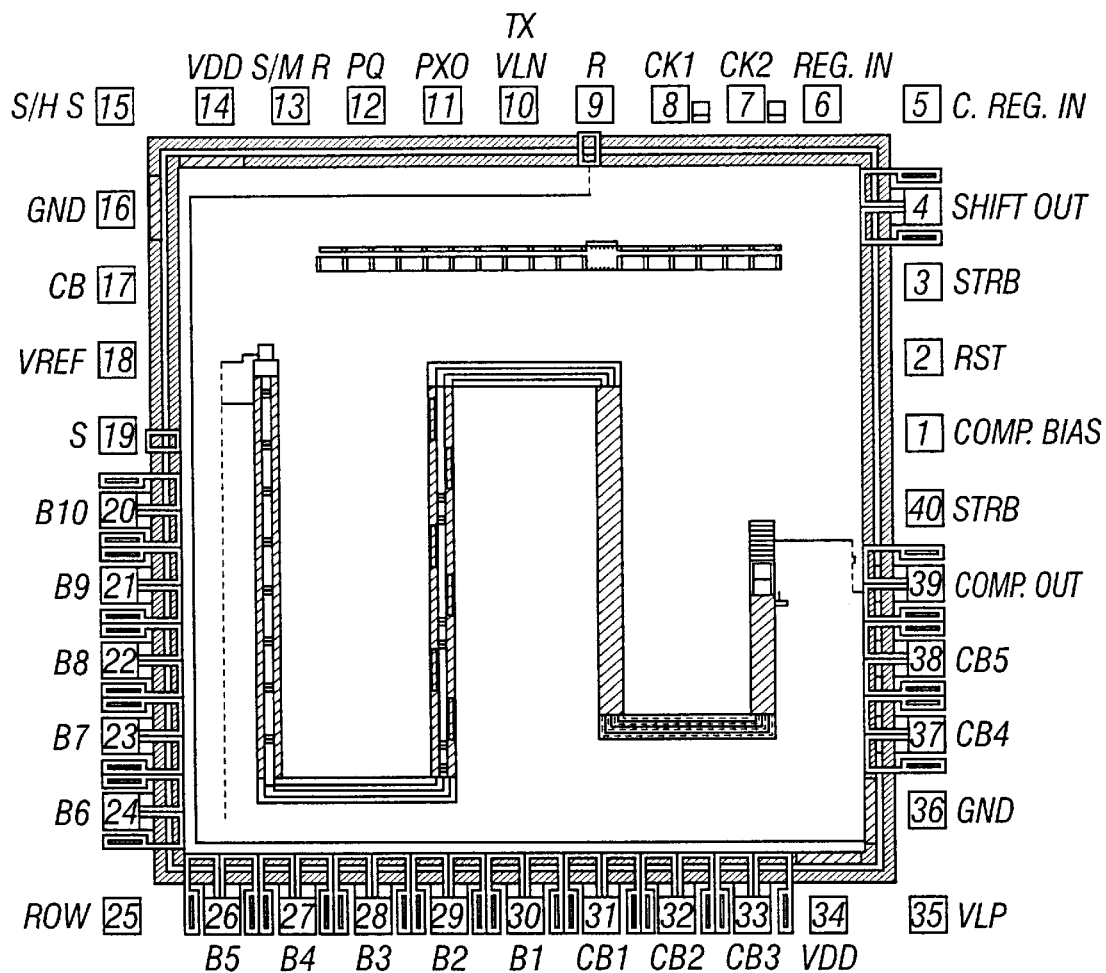
FIG. 22 illustrates pad connections for the analog-to-digital converter of FIG. 9.

Each digital output from the test chip is buffered by the digital output pad. The analog voltage levels on the sample line and reset line are monitored by two PMOS source follower output pads. One pixel is included in the chip while extra input pad is connected to the pixel output node (PXO). Shift register has one extra bit to drive a monitor pad without interfering its driving operation to the column circuit. The column circuit is about 4 mm long, which is bent to fix into a standard MOSIS tiny frame. The Pad connections are illustrated in FIG. 22.

FIG. 23 shows another embodiment of the invention which is designed to improve common-non-ideality mode rejection. This is a double-sided charge coupled successive approximation ADC 92 which is designed to accept a differential input. The two sides of the differential input 94, 96 are used as the clamp signals to the upper and lower MDACs 98, 100. The digital registers 102, 104 are initially set to all zeros during the clamping operation. The comparator 106 is strobed and the lower level input is determined. The MSB on the lower level side is set to a "one". The comparator 106 is then strobed again. The next significant bit on the resulting lower side is set to "one". This process is repeated for n-bits.

One digital register 102 holds the converted value, another holds its two's complement. This approach works for both "positive" and "negative" signals, as the first bit can be interpreted as a sign bit. Offset can be digitally compensated by setting the input voltage to zero, (both sides equal) and storing the results in digital output.

Figure 25:
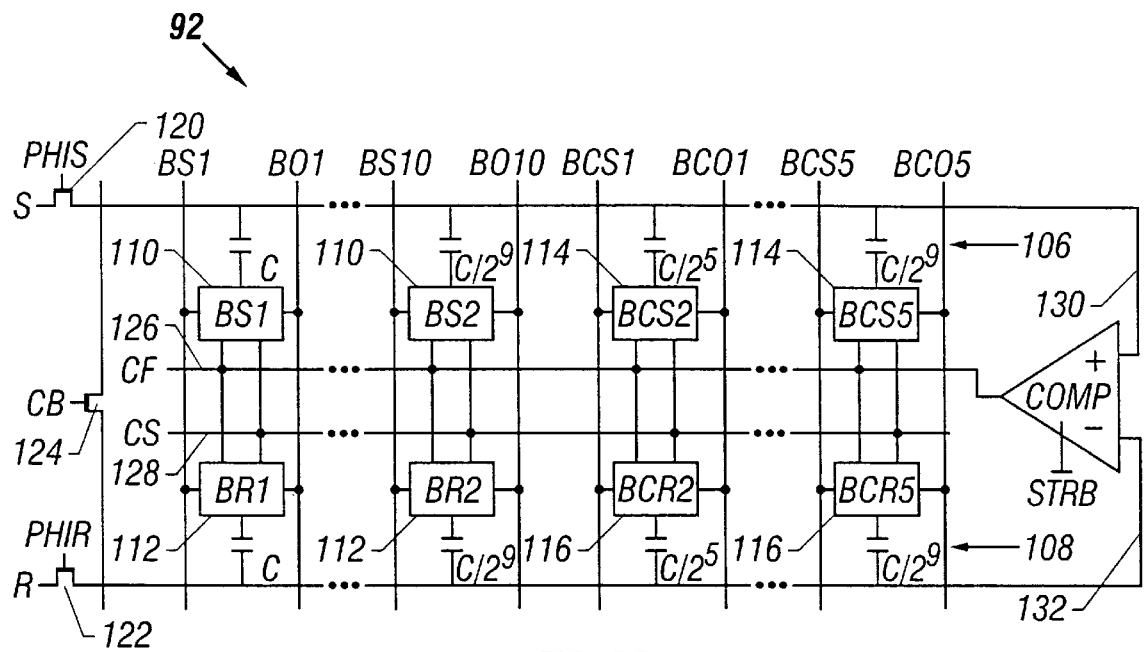
FIG. 25 shows a block diagram of the analog-to-digital converter circuit of FIG. 23.

FIG. 25 shows a block diagram of the double sided ADC 92. It has ten conversion bits and five correction bits for compensating the DC offset at the input of the comparator. In more detail, the double-sided ADC 92 includes sample 106 and reset 108 capacitor banks. The ten conversion bits are generated using ten sample conversion bit cells 110 and ten reset conversion bit cells 112. The five correction bits are generated using five sample correction bit cells 114 and five reset correction bit cells 116. The ADC 92 also includes comparator 118 sample and reset switches 120, 122, crowbar switch 124, CF the comparator feedback 126, CS the comparator sample 128, and feedback loops 130 and 132. A shift register in bit cells 110, 112 stores the output bits which are output on BO1 through BO10.

Compared to the single-side approach shown in FIG. 9, this ADC 92 uses a modified algorithm. The comparator 18 output 134 activates the cells on both the sample and reset sides. This sets the bottom of the capacitor to a voltage of $V_{ref}$. If the voltage level is lower on this side, while maintaining the zero voltage on the other side. Therefore at each conversion step, the lower voltage side is charged up by the specific bit voltage. There is no reset action even if the output of the comparator is low.

Figure 26:
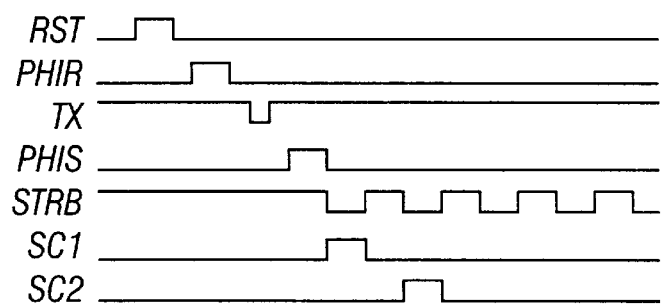
FIG. 26 shows a clock diagram of the circuit operation of the analog-to-digital converter of FIG. 25.

The operation of the converter is controlled by using the clock scheme shown in FIG. 26. After one row is selected, all the bit cells in the converter are reset at the same time as the pixel in a row are reset. This ensures that the bottoms of all the capacitors in the reset and sample capacitor banks are connected to ground. Then the pixel reset level is sampled onto the reset capacitor bank, and the signal level onto the sample bank, after the transfer gate (TX) dumps the charges out to the single chain. Once this analog charge readout is finished, the strobed comparator is then activated to start the conversion process.

The sample and reset levels, the latter being higher due to the specific source follower readout scheme, are fed into the comparator 118 in such a way that the output of the comparator for the first strobe cycle is a logic high. This will then be read into the first bit cell (MSB) as it is being selected by the shift register scanner and forces the bottom of the bit sample capacitor to $V_{ref}$. This reference voltage is usually the saturation of the signal level relative to the reset level; in this case it is about 1.2 volts. At the same time, the bottom of the bit reset capacitor is kept grounded. As a result, the sample level is charged up by one-half the $V_{ref}$.

The conversion process then moves to the next bit where the second comparison is performed by the comparator. This will set the $V_{ref}$ voltage to the bottom of the capacitor on the lower voltage side while keeping the zero voltage on the other. This process continues until the ten-bit conversion is finished. The same operation is performed for the five correction bits after the crowbar 124 is switched on. The first correction bit directly serves as the sign bit. No sign bit controlled side selection is needed in this embodiment. The output of each bit can be taken from either the sample cell or the reset cell, since they are exactly inverted (two's complement).

Compared with the single sided approach, this double sided approach is much faster since only one strobe cycle is needed for one bit conversion. The extra clock to cut off the comparator feedback is not needed. All the sample and reset unit cell designs and layout are the same. On the other hand, it needs somewhat more chip area because every bit consists two unit cells to ensure both the sample and reset sides active.

Figure 27:
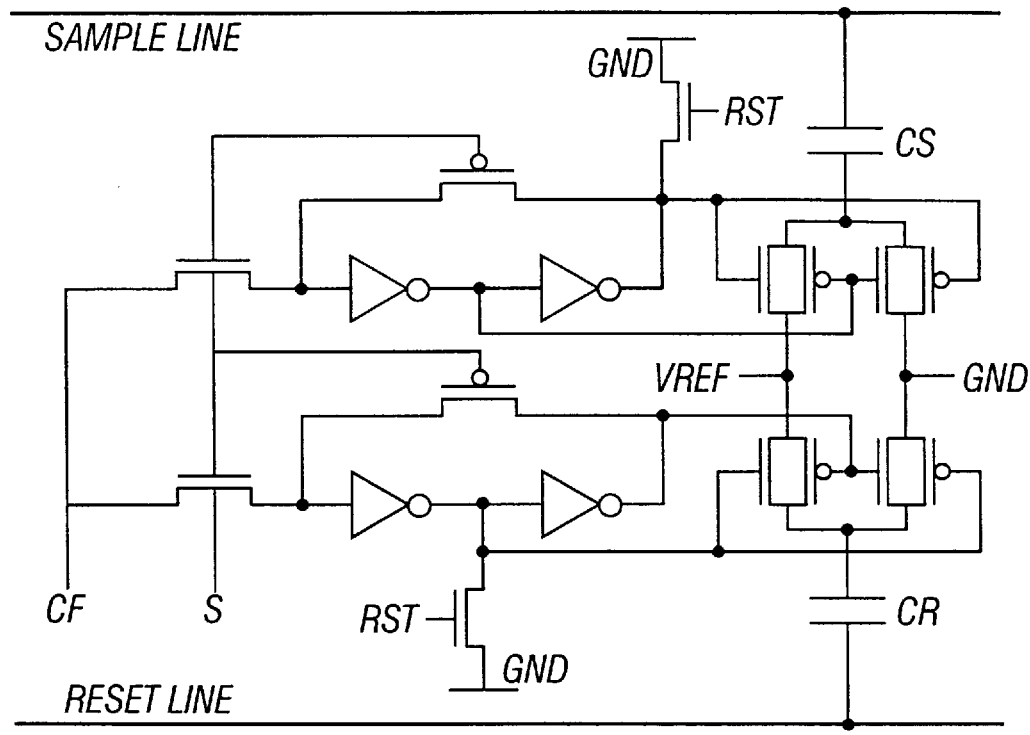
FIG. 27 shows a diagram of a unit cell circuit for one conversion bit used in the analog-to-digital converter of FIG. 25.

The unit cell uses regular latches with their inverted and non-inverted signals controlling the switches to set the voltages at the bottom of the bit capacitors. FIG. 27 is the schematic of the circuit for one conversion bit cell. In contrast to the single sided approach, the complementary MOS transistors are adopted for these internally controlled switches to ensure a good transfer of the analog voltages. The size of all the NMOS transistors is 3/2, and that of the PMOS transistors is 6/2.

Figure 28:
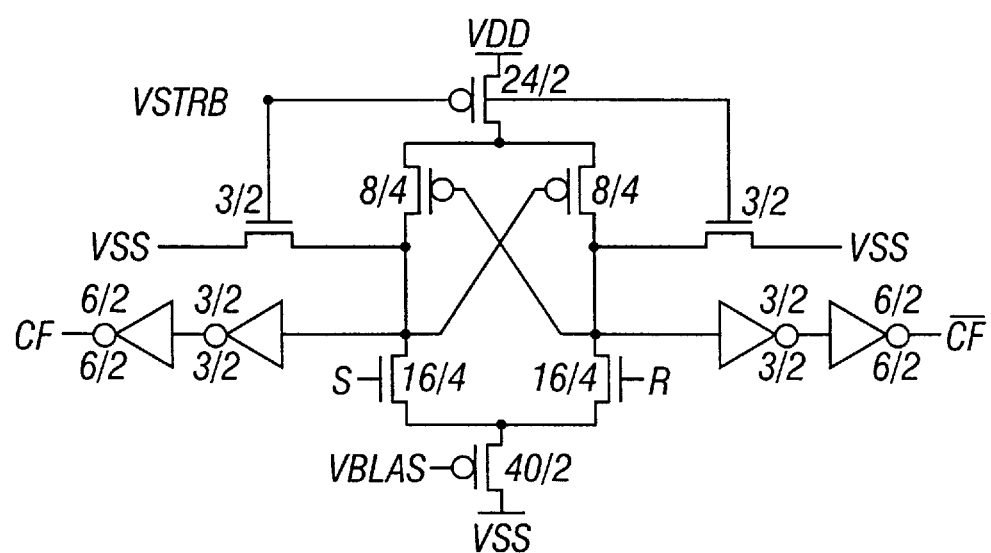
FIG. 28 shows a circuit diagram of a strobed comparator used in the analog-to-digital converter of FIG. 25.

The strobed comparator used in this ADC 92 is shown in FIG. 28. The operation of the comparator needs a reset before each comparison. This strobe operation ensures that both output nodes of the comparator start with zero voltage for each comparison so that they push the comparator to the state determined by the differential input.

Figure 29:
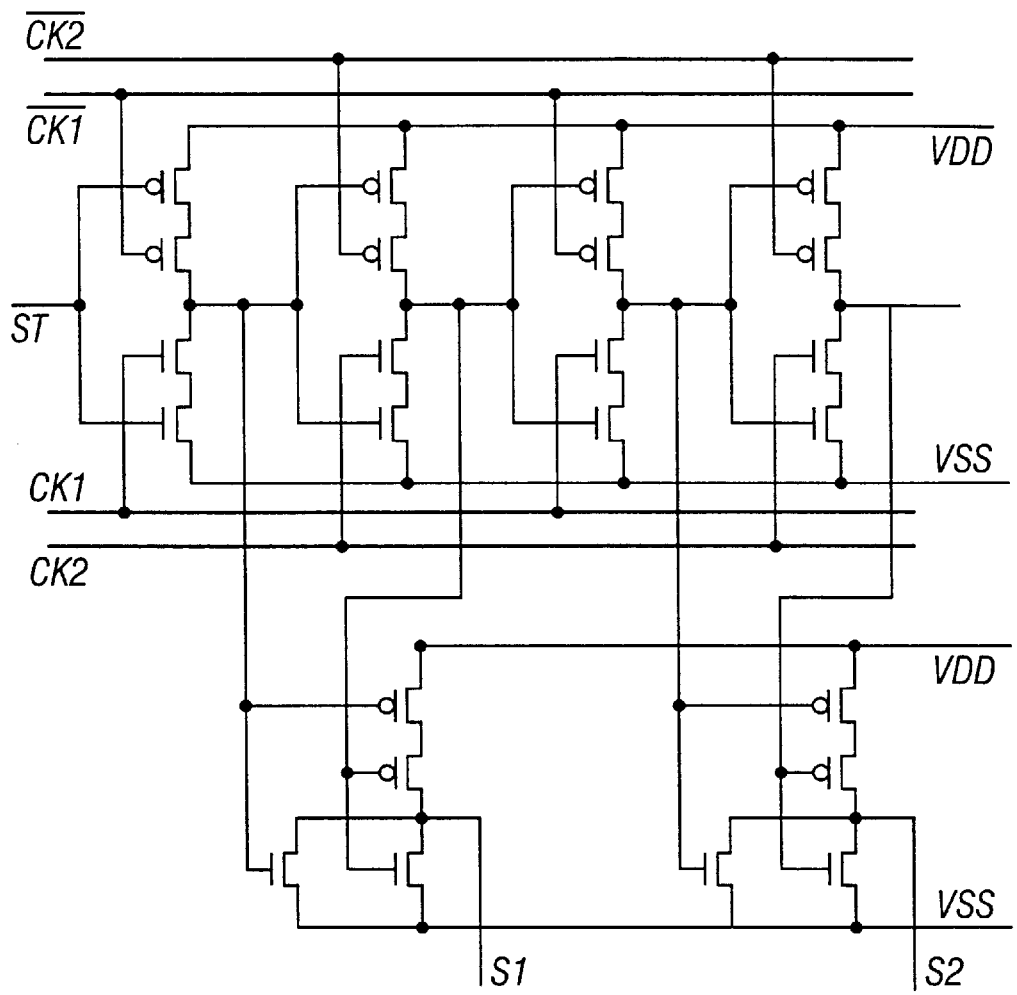
FIG. 29 shows a block diagram of a shift register used with the analog-to-digital converter of FIG. 25.
Figure 30:
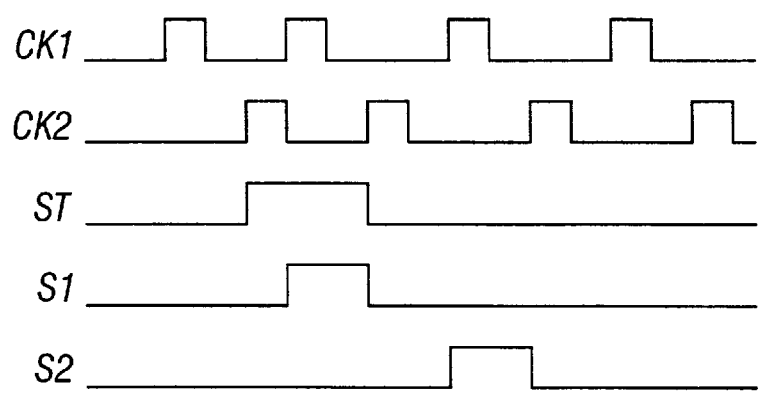
FIG. 30 shows a clock diagram of the operation of the shift register circuit in FIG. 29.

The bit cells in the converter are scanned from MSB to LSB by a shift register type of scanner in the bit cells. The dynamic design of the shift register is adopted in this scanner, which requires two clocks to control the progress of the scan and one triggering signal to start the scan. One bit cell in the scanner consists of two clocked inventors and one NOR gate. FIG. 29A–B illustrates the design and operation of the shift register scanner. After the shift register is started, the rising edge of CK1 makes the first bit cell selected by an output high at the cell address and the following rising edge of CK2 deselects the cell by making the output low again. The next clock cycle does the same operation to the second bit cell, and so on. The size of the NMOS transistors is 10/2, and that of the PMOS transistors 20/2.

Figure 31:
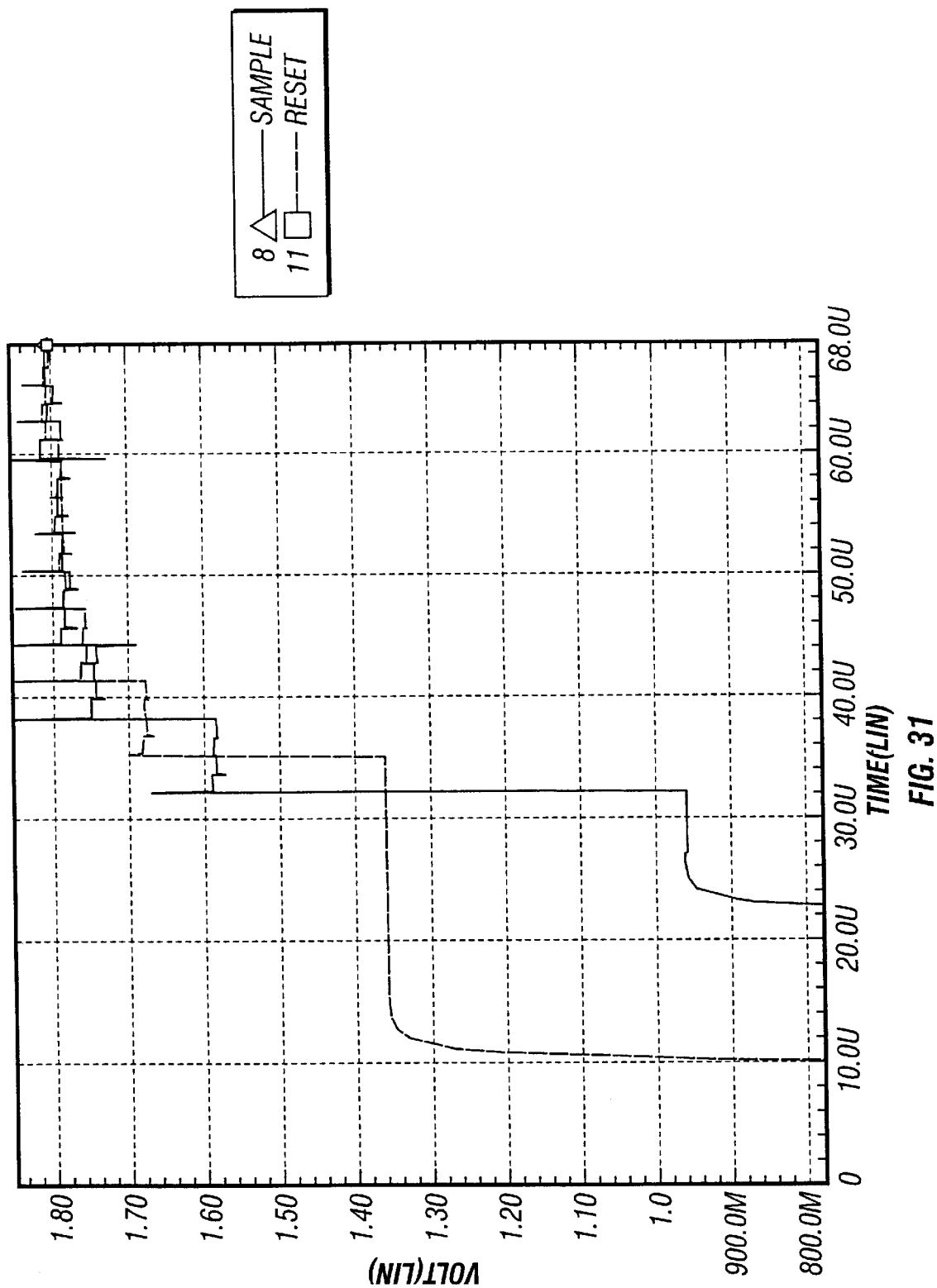
FIG. 31 shows output waveforms of the analog-to-digital converter of FIG. 25.
Figure 32A:
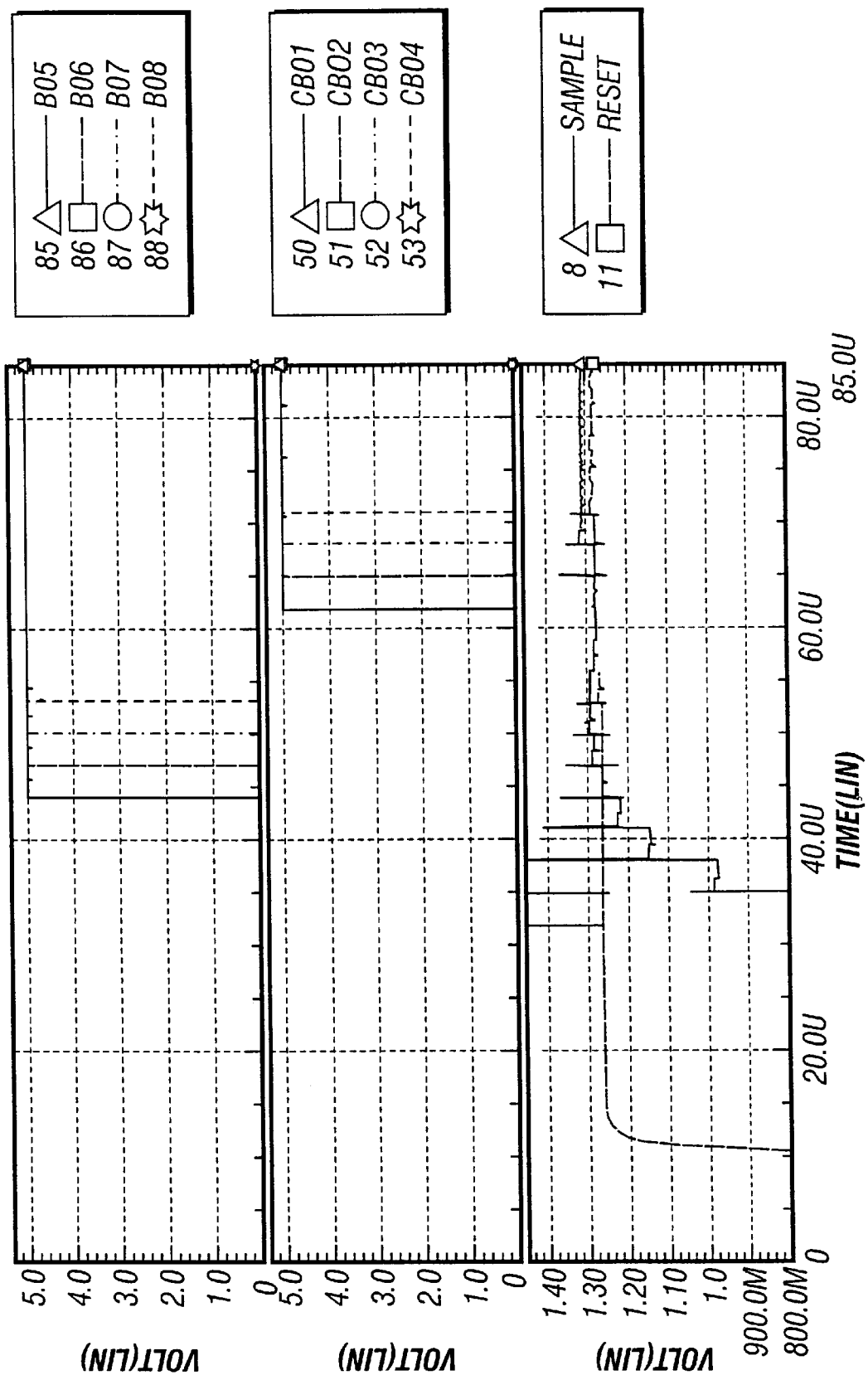
FIGS. 32A and 32B show simulation results for the analog-to-digital converter of FIG. 25 without connecting the shift register column selection transistors or output pads.
Figure 32B:
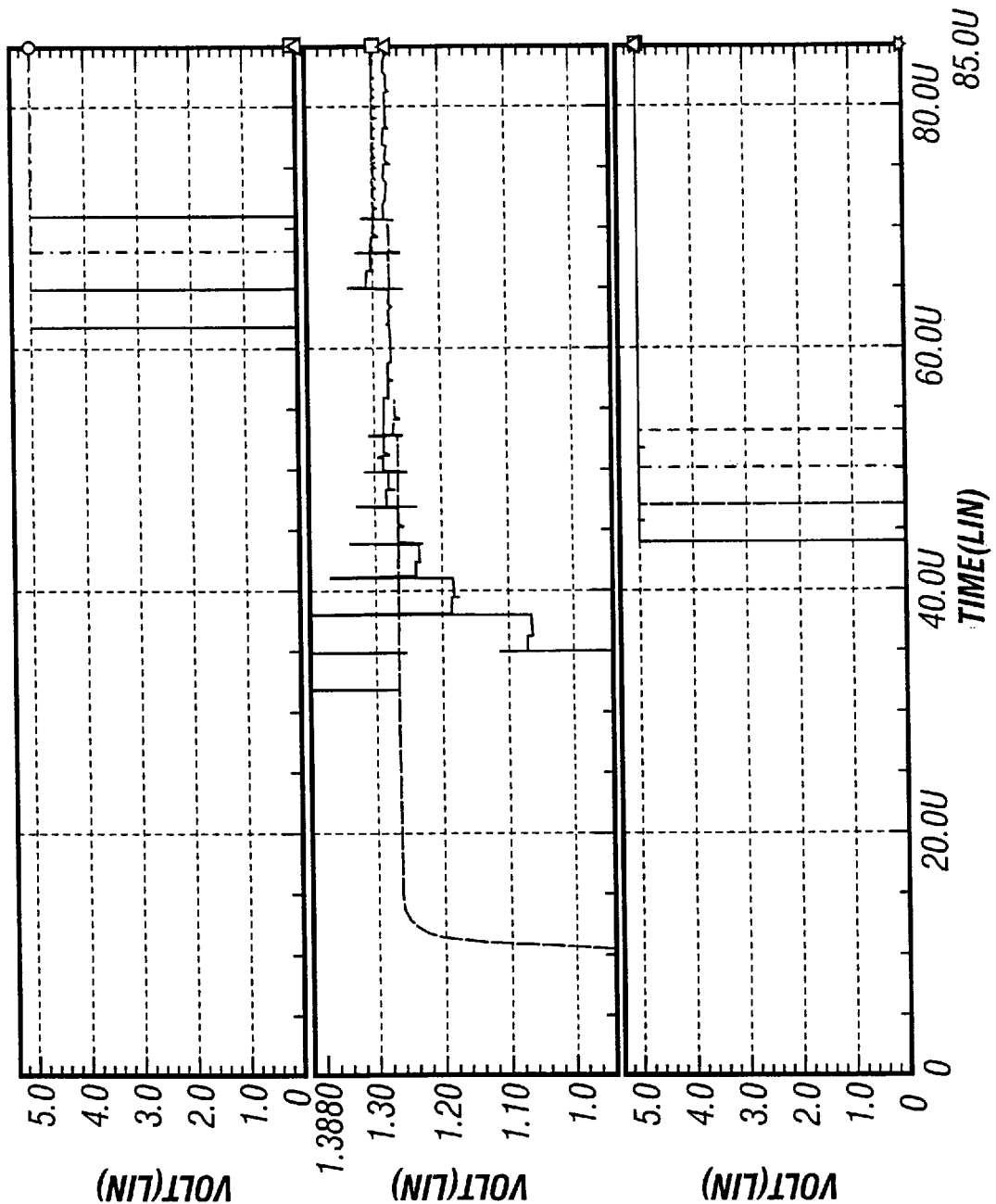

Simulations of the circuits were done using both Hspice and Pspice. Due to the simulation capacity limitation of the version of Pspice used, complete circuit operations had to be simulated using Hspice. FIG. 31 is a print-out of typical output waveforms. The voltage on the lower voltage side is raised up in each bit conversion as the conversion process progresses, the sample line and reset line voltages will approach each other while they both generally increase in amplitude. FIGS. 32A–B show the sample results without connecting the driving shift register, the column selection transistors, and the output pads. Four last conversion bits are plotted with four correction bits.

The ADC 92 is laid out in a column width of 40 $\mu$m using MOSIS double poly, double metal 2 $\mu$m n-well design rules. Four metal-two wires run vertically in the column for the sample line, reset line, comparator feedback and column selection.

Each digital output from the test chip is buffered by the digital output pad. The analog voltage levels on the sample line and reset line are monitored by two PMOS source follower output pads. One pixel is included in the chip while an extra input pad is connected to the pixel output node (PXO). The shift register has two extra bits to drive two monitor pads without interfering its driving operation to the column circuit.

Figure 33:
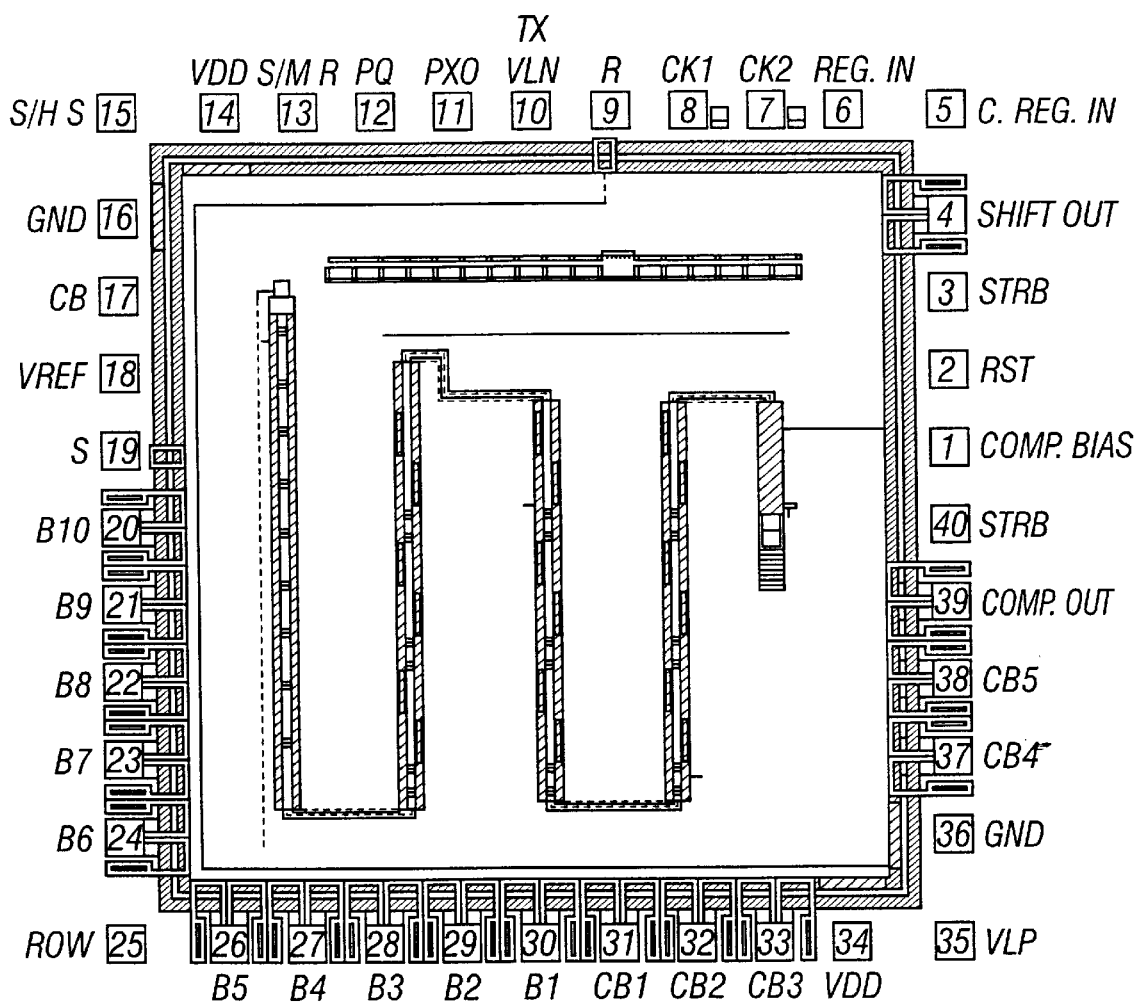
FIG. 33 shows the pad connections for the analog-to-digital converter circuit of FIG. 25.

The column circuit is about 6 mm long, which is bent to fix into a standard MOSIS tiny frame. The pad connections are illustrated by FIG. 33.

Both the ADCs 64, 92 have been constructed and shown to be functional. The ADCs were laid out using 2 micron design rules, fitting in a 40 micron width. The length of the single-sided ADC 64 was 4 mm and the double-sided ADC 92 was 6 mm. The double-sided ADC was suitable for a column-parallel ADC architecture (one ADC per image sensor pixel column) operating for a 1024×1024 sensor at least 300 frames per second, assuming half of the readout time would be spent in reading out the converted digital signals off chip.

The single-sided ADC 64 was also implemented using a 1.2 micron CMOS foundry process. The chips were laid out as 24 microns wide for the 1.2 um process and were 5.4 mm long for 10 bits plus 5 offset correction bits.

The chip was tested for input-output characteristics. FIG. 24 shows the input to the ADC as a 1 volt p—p triangular wave. The input is sampled many times over its period. The digital output was sent to a commercial digital to analog converter, and the resultant analog output is displayed as well. A perfect ADC would result in a very smooth output waveform. The flat regions indicate a differential non-linearity effect.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. An analog-to-digital converter monolithically integrated and electrically connected to at least one active pixel in a CMOS active pixel array to receive a sample signal input from the active pixel indicating a total charge of radiation-induced charge and non-radiation-induced background charge in the active pixel and a reset signal input indicating the non-radiation-induced background charge in the active pixel, comprising:

a comparator receiving said sample signal input and a comparison input correlated to said reset signal input and generating an output indicating which of said sample signal input or said comparison input is larger;

a capacitively coupled multiplying digital to analog converter ("CCMDAC") comparison voltage circuit, coupled to one input of said comparator and configured to receive said sample signal input, said CCMDAC comparison voltage circuit having a plurality of sample capacitors and bit cells respectively connected to said sample capacitors to operate on a common reference voltage and generating a succession of comparison output voltages to use as said comparison input for said comparator, wherein each bit cell operates to control a voltage of a respective sample capacitor according to a correlation with said reset signal input and stores a bit level corresponding to said respective sample capacitor; and a plurality of reset capacitors connected in parallel to receive and temporarily hold said reset signal input, wherein said CCMDAC comparison circuit and said comparator are configured to generate bit levels in said bit cells to represent only said radiation-induced charge in said active pixel by substantially removing contribution caused by said non-radiation-induced background charge in said active pixel.

2. An analog-to-digital converter according to claim 1 wherein said succession of comparison voltage levels increases by successively smaller increments.

3. An analog to digital converter as in claim 1 wherein said CCMDAC comparison voltage circuit implements a successive approximation algorithm.

4. An analog-to-digital converter as in claim 1 wherein a sample capacitor attached to a corresponding bit cell is one-half the capacitive value of another sample capacitor for another sample capacitor that represents the next most significant bit.

5. An image sensor comprising:

a substrate made of a semiconductor material;

an array of image sensor pixels formed on said substrate, each pixel generating a sample signal representing a total amount of radiation-induced charge and non-radiation-induced background charge and a reset signal representing said non-radiation-induced background charge;

a plurality of sample capacitors formed on said substrate and connected relative to one another to receive said sample signal;

a plurality of reset capacitors formed on said substrate and each corresponding to one of said sample capacitors, said reset capacitors connected relative to one another to receive said reset signal;

a plurality of bit cells formed on said substrate and each connected to one sample capacitor, each bit cell having a logic circuit to control a voltage on a corresponding sample capacitor according to a comparison of said sample signal and said reset signal to effectively subtract said reset signal from said sample signal, wherein each bit cell produces and stores a bit level indicating said radiation-induced charge; and a comparator formed on said substrate having two inputs and one output, generating an output indicating which of the two inputs is larger, said two inputs coupled to a group of image sensor pixels to receive said voltage from one sample capacitor at a time and said reset signal to produce a control signal to each bit cell, wherein said bit cells and said comparator operate according to a common reference voltage and permit said sample signal or said reset signal exceeds said common reference voltage as long as a differential signal Produced by subtracting said reset signal from said sample signal does not exceed said common reference voltage.

6. An imaging system comprising:

an array of image sensors comprising an array of pixel sensors formed on a substrate and arranged in columns and rows, each pixel operating to produce a sample signal representing a total amount of radiation-induced charge and non-radiation-induced background charge and a reset signal representing said non-radiation-induced background charge;

column-parallel readout circuitry formed on said substrate and configured to have readout elements to read out all columns in parallel;

a plurality of successive approximation analog-to-digital converters formed on said substrate and each connected to one readout element in said column-parallel readout circuitry, each analog-to-digital converter comprising:

a first capacitively coupled multiplying digital to-analog converter (CCMDAC) connected to receive said sample signal and configured to have a plurality of sample capacitors, said first CCMDAC operable to generate a first comparison voltage;

a first digital register connected to said first CCMDAC to control a voltage in each sample capacitor and said first comparison voltage;

a second CCMDAC connected to receive said reset signal and configured to have a plurality of reset capacitors each corresponding to said sample capacitors, said CCMDAC operable to generate a second comparison voltage;

a second digital register connected to said first CCMDAC to control a voltage in each sample capacitor and said first comparison voltage;

a comparator having two inputs connected to respectively receive said first and second comparison signals, the comparator operating to produce an output signal to indicate which of said two inputs is larger;

wherein said output signal is fed back to control both of said first and second digital registers to chance a voltage in either a sample capacitor or a reset capacitor without resetting any capacitor to indicate a bit level that represents only said radiation-induced charge.

* * * * *